(12) United States Patent
Ahmed et al.

(10) Patent No.: US 12,176,221 B2
(45) Date of Patent: Dec. 24, 2024

(54) INCORPORATING SEMICONDUCTORS ON A POLYCRYSTALLINE DIAMOND SUBSTRATE

(71) Applicant: Texas State University, San Marcos, TX (US)

(72) Inventors: Raju Ahmed, San Marcos, TX (US); Edwin L. Piner, San Marcos, TX (US)

(73) Assignee: Texas State University, San Marcos, TX (US)

(*) Notice: Subject to any disclaimer, the term of this patent is extended or adjusted under 35 U.S.C. 154(b) by 485 days.

(21) Appl. No.: 17/612,201

(22) PCT Filed: May 31, 2019

(86) PCT No.: PCT/US2019/034938
§ 371 (c)(1),
(2) Date: Nov. 17, 2021

(87) PCT Pub. No.: WO2020/242494
PCT Pub. Date: Dec. 3, 2020

(65) Prior Publication Data
US 2022/0246444 A1  Aug. 4, 2022

(51) Int. Cl.
*H01L 21/48* (2006.01)
*C23C 16/27* (2006.01)
(Continued)

(52) U.S. Cl.
CPC .......... *H01L 21/4803* (2013.01); *C23C 16/27* (2013.01); *C23C 16/345* (2013.01);
(Continued)

(58) Field of Classification Search
CPC .......... H01L 21/4803; H01L 21/02381; H01L 21/02458; H01L 21/02488; H01L 21/0254;
(Continued)

(56) References Cited

U.S. PATENT DOCUMENTS 5,131,963 A * 7/1992 Ravi ................. H01L 21/02381
148/DIG. 135
5,204,210 A   4/1993 Jansen et al.
(Continued)

OTHER PUBLICATIONS

Partial European Search Report for European Patent Application No. 19 930 465.0 dated Jan. 30, 2023, pp. 1-9.
(Continued)

*Primary Examiner* — Jay C Kim
(74) *Attorney, Agent, or Firm* — Robert A. Voigt, Jr.; Shackelford, McKinley & Norton, LLP

(57) ABSTRACT

A method for incorporating semiconductors on a diamond substrate. A buffer layer (e.g., GaN) is grown on a transition layer (e.g., AlN/AlGaN) residing on a substrate. A silicon nitride layer is then grown on the buffer layer. After selectively seeding diamond on the silicon nitride layer, the selective seeding of the diamond is dry etched to form regions with seeded diamond and regions without seeded diamond. The silicon nitride is selectively etched in the regions without seeded diamond and diamond is grown in the regions with seeded diamond forming regions of diamond. Additional Group III-nitride semiconductor material (e.g., GaN) is grown in the etched regions without seeded diamond to fill such regions to reach a level of the regions with diamond. An epitaxial overgrowth of the Group III semiconductor material at and above the level of the regions with diamond is then performed.

10 Claims, 27 Drawing Sheets

(51) Int. Cl.

| | | |
|---|---|---|
| *C23C 16/34* | (2006.01) | |
| *C23C 16/50* | (2006.01) | |
| *C23C 16/56* | (2006.01) | |
| *C30B 25/18* | (2006.01) | |
| *C30B 29/04* | (2006.01) | |
| *C30B 29/40* | (2006.01) | |
| *H01L 21/02* | (2006.01) | |
| *H01L 21/78* | (2006.01) | |
| *H01L 23/373* | (2006.01) | |
| *H01L 29/20* | (2006.01) | |
| *H01L 29/778* | (2006.01) | |

(52) U.S. Cl.
CPC .............. *C23C 16/50* (2013.01); *C23C 16/56* (2013.01); *C30B 25/183* (2013.01); *C30B 25/186* (2013.01); *C30B 29/04* (2013.01); *C30B 29/406* (2013.01); *H01L 21/02381* (2013.01); *H01L 21/02458* (2013.01); *H01L 21/02488* (2013.01); *H01L 21/0254* (2013.01); *H01L 21/02647* (2013.01); *H01L 21/7806* (2013.01); *H01L 23/3732* (2013.01); *H01L 29/2003* (2013.01); *H01L 29/7786* (2013.01)

(58) Field of Classification Search
CPC ........... H01L 21/02647; H01L 21/7806; H01L 23/3732; H01L 29/2003; H01L 29/7786; C23C 16/27; C23C 16/345; C23C 16/50; C23C 16/56; C30B 25/183; C30B 25/186; C30B 29/04; C30B 29/406
See application file for complete search history.

(56) References Cited

U.S. PATENT DOCUMENTS

| | | | |
|---|---|---|---|
| 5,474,808 A * | 12/1995 | Aslam .................... | C23C 16/27 427/430.1 |
| 6,054,183 A * | 4/2000 | Zimmer ................. | C23C 16/27 427/249.11 |
| 7,285,479 B2 * | 10/2007 | Tachibana ......... | H01L 21/02123 438/464 |
| 7,595,507 B2 | 9/2009 | Francis et al. | |
| 7,884,373 B2 | 2/2011 | Korenstein et al. | |
| 7,888,171 B2 | 2/2011 | Korenstein et al. | |
| 7,989,261 B2 | 8/2011 | Korenstein et al. | |
| 8,026,581 B2 | 9/2011 | Hanson et al. | |
| 8,129,733 B2 | 3/2012 | Linares | |
| 8,174,024 B2 | 5/2012 | Korenstein et al. | |
| 8,283,189 B2 | 10/2012 | Francis et al. | |
| 8,283,672 B2 | 10/2012 | Francis et al. | |
| 8,435,833 B2 | 5/2013 | Linares | |
| 8,575,657 B2 | 11/2013 | Gambin et al. | |
| 8,674,405 B1 | 3/2014 | Babic et al. | |
| 8,759,134 B2 | 6/2014 | Ejeckam et al. | |
| 8,945,966 B2 | 2/2015 | Francis et al. | |
| 9,359,693 B2 | 6/2016 | Francis et al. | |
| 9,685,513 B2 * | 6/2017 | Kub .................... | H01L 29/2003 |
| 10,276,656 B2 * | 4/2019 | Hille .................. | H01L 21/2252 |
| 10,457,089 B2 * | 10/2019 | Wang ................ | H01J 37/32192 |
| 2009/0065788 A1 | 3/2009 | Baskaran et al. | |
| 2010/0327228 A1 | 12/2010 | Bando et al. | |
| 2012/0325139 A1 * | 12/2012 | Wei .................... | H01L 21/0237 117/106 |
| 2013/0183798 A1 | 7/2013 | Francis et al. | |
| 2014/0141595 A1 | 5/2014 | Babic et al. | |

OTHER PUBLICATIONS

International Search Report for International Application No. PCT/US2019/034938 dated Aug. 9, 2019, pp. 1-2.

Written Opinion of the International Searching Authority for International Application No. PCT/US2019/034938 dated Aug. 9, 2019, pp. 1-4.

Dumka et al., "AlGaN/GaN HEMTs on Diamond Substrate with over 7 W/mm Output Power Density at 10 GHZ," Electronics Letters, vol. 49, No. 20, Sep. 2013, pp. 1298-1299.

Chao et al., "GaN-on-Diamond HEMTs with 11 W/mm Output Power at 10GHz," MRS Advances, vol. 1, No. 2, 2016, pp. 147-155.

Francis et al., "Formation and Characterization of 4-inch GaN-on-Diamond Substrates," Diamond & Related Materials, vol. 19, No. 2, 2010, pp. 229-233.

Dumka et al., "Electrical and Thermal Performance of AlGaN/GaN HEMTs on Diamond Substrate for RF Applications," Compound Semiconductor Integrated Circuit Symposium (CSICS), Monterey, CA, U.S.A., Oct. 13-16, 2013, pp. 1-4.

Jessen et al., "AlGaN/GaN HEMT on Diamond Technology Demonstration," Compound Semiconductor Integrated Circuit Symposium, San Antonio, TX, U.S.A., Nov. 12-15, 2006, pp. 1-4.

Faili et al., "GaN-on-Diamond Substrates for HEMT Applications," Diamond Tooling Journal, 2009, pp. 52-55.

Sun et al., "Reducing GaN-on-Diamond Interfacial Thermal Resistance for High Power Transistor Applications," Applied Physics Letters, vol. 106, 111906, 2015, pp. 1-4.

Liu et al., "GaN-on-Diamond Electronic Device Reliability: Mechanical and Thermo-Mechanical Integrity," Applied Physics Letters, vol. 107, No. 25, 2015, pp. 1-7.

Ejeckam et al., "GaN-on-Diamond Wafers: Recent Developments," Semiconductor Technology International Conference, China, 2015, pp. 1-3.

Ejeckam et al., "3,000+ Hours Continuous Operation of GaN-on-Diamond HEMTs at 350 Channel Temperature," Semiconductor Thermal Measurement and Management Symposium (SEMI-THERM), San Jose, Ca, U.S.A., Mar. 9-13, 2014, pp. 242-246.

* cited by examiner

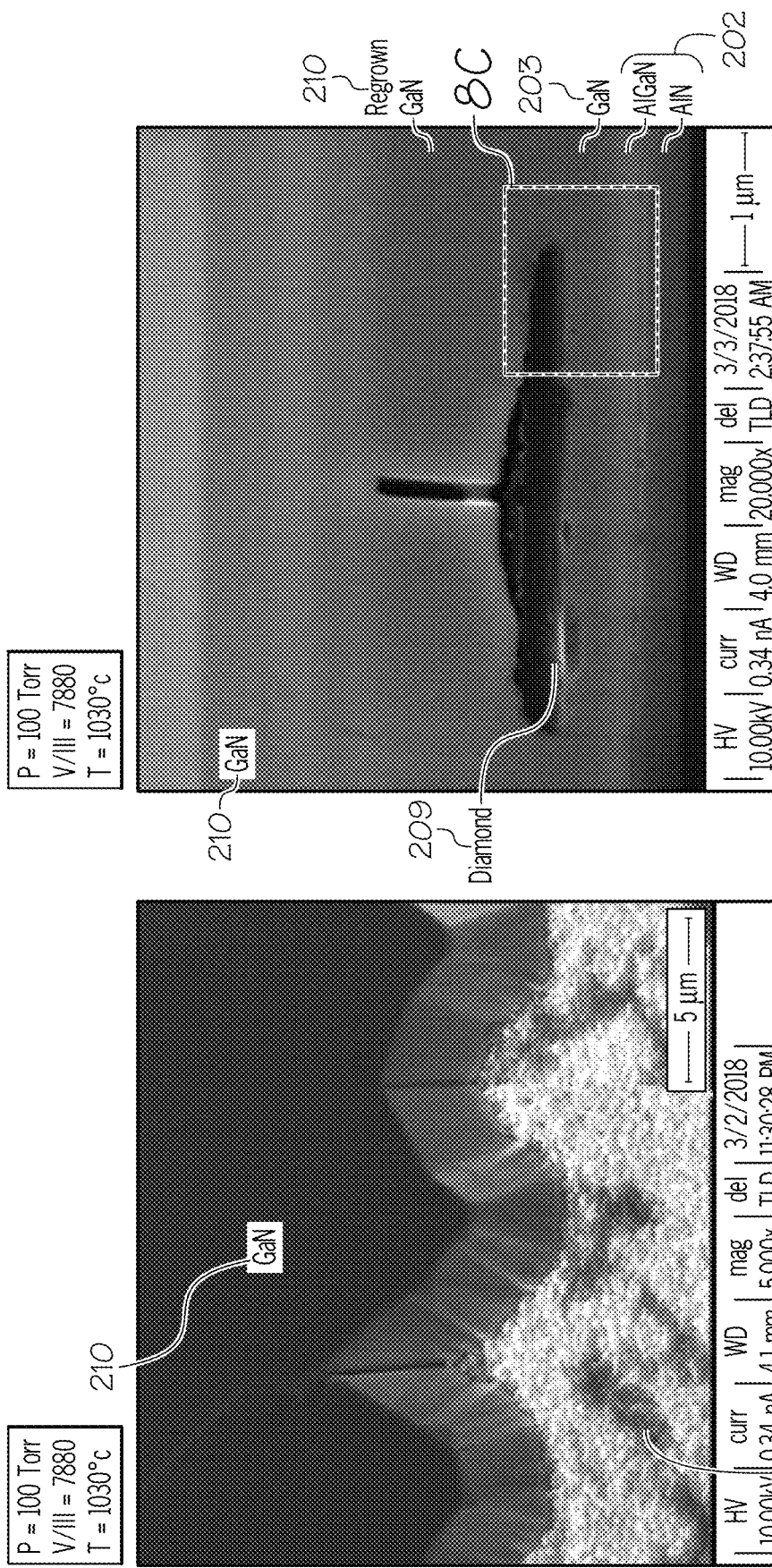

INCORPORATING SEMICONDUCTORS ON A POLYCRYSTALLINE DIAMOND SUBSTRATE

TECHNICAL FIELD

The present invention relates generally to wide bandgap semiconductor materials, and more particularly to incorporating semiconductors (e.g., III-nitrides, III-oxides, III-arsenides, III-phosphides, III-antimonides, II-VI materials, germanium and silicon) on a polycrystalline diamond substrate.

BACKGROUND

Wide bandgap semiconductor materials are extensively used in high power and optoelectronics due to their large direct bandgap which facilitates emission of high energetic light or transmission of high frequency electromagnetic signals. Today's most powerful light emitting diodes, blue lasers and transistors are made of such wide bandgap materials. Group III-nitride semiconductor materials, such as gallium nitride (GaN), aluminum nitride (AlN), indium nitride (InN), boron nitride (BN) and their alloys, cover a very wide energy band leading to superior performance over other semiconductor materials for high power electronics. Emission of high energy light (blue or ultraviolet (UV)) from light emitting diodes (LEDs) and lasers is now possible due to the use of these materials as the active regions in those devices. In addition, this class of materials has unique polarization properties which are not available in any other wide bandgap semiconductor material. Due to piezo electric and spontaneous polarization, a high density ($>10^{13}$ $cm^{-2}$) channel of highly mobile electrons called two dimensional electron gas (2DEG) exists near the interface of a wide bandgap (e.g., AlGaN) and a narrower bandgap (e.g., GaN) of group III-nitride semiconductors. The 2DEG is an important feature of group III-nitride-based high electron mobility transistors (HEMTs).

The presence of the 2DEG channel has made the AlGa(In)N/GaN HEMT an excellent candidate for high power and high frequency electronic devices. High power operation exceeding 40 W/mm has been reported for such a device. Due to such high power operation, excessive heat is generated at the active layer of these devices and this heat is needed to be removed to maintain device performance and reliability. Among many substrate materials, chemical vapor deposited (CVD) polycrystalline diamond has been used extensively in recent years as a substrate material due to its high thermal conductivity (≈800-1,800 W/m-K). The GaN-on-diamond technology has been incorporated in radio frequency (RF) transistors and has already demonstrated excellent scalability, and promising electrical and thermal performance.

Many articles and patents have been published on fabrication of GaN-on-diamond devices. In most of the published techniques, GaN is grown using metal organic CVD (MOCVD) on a single crystal substrate and attached to CVD grown diamond substrates using interfacial materials. In some of the techniques, diamond is grown on GaN and the substrate wafer is then etched from the backside to access the device. Most of these processes involve multiple steps of growth and substrate transfer. However, despite all the advanced approaches, thermal management in GaN-on-diamond devices still remains a significant challenge due to two important factors, namely, thermal boundary resistant (TBR) between different layers and graphitic carbon in the diamond nucleation layer (at the GaN-diamond interface). TBR is inevitable for wafer transfer technology and can only be minimized in GaN devices if said devices are directly formed on diamond. Since growing crystalline GaN on a foreign substrate (single crystal) is a significant challenge due to lattice and coefficient of thermal expansion (CTE) mismatch, it is, thus far, impossible to grow crystalline GaN directly on polycrystalline diamond. In the case of CVD diamond growth on GaN, graphitic carbon is unavoidable in the diamond nucleation layer during growth, and, unfortunately, it has very poor thermal conductivity.

Hence, there is not currently an effective means for directly growing semiconductors (e.g., III-nitrides) on a diamond substrate with the active layer residing closest to the diamond substrate so as to improve the heat removal capability in comparison to current techniques.

SUMMARY

In one embodiment of the present invention, a method for incorporating semiconductors on a diamond substrate comprises growing a buffer layer on a transition layer residing on a substrate, where the buffer layer comprises a first Group III semiconductor material, and where the transition layer comprises a second Group III semiconductor material. The method further comprises growing a silicon nitride layer on the buffer layer. The method additionally comprises performing selective seeding of diamond on the silicon nitride layer. Furthermore, the method comprises dry etching the selective seeding of diamond to form regions with seeded diamond and regions without seeded diamond. Additionally, the method comprises performing selective etching of the silicon nitride layer in the regions without seeded diamond forming etched regions without seeded diamond. In addition, the method comprises growing diamond in the regions with seeded diamond forming regions of diamond. The method further comprises growing additional the first Group III semiconductor material in the etched regions without seeded diamond to fill the regions without seeded diamond to reach a level of the regions with diamond. The method additionally comprises performing an epitaxial overgrowth of the first Group III semiconductor material at the level of the regions with diamond.

In another embodiment of the present invention, a method for incorporating semiconductors on a diamond substrate comprises dispersing diamond seeds containing photoresist in regions on a substrate. The method further comprises exposing the diamond seeds containing photoresist to ultraviolet radiation to develop. The method additionally comprises dry etching the developed diamond seeds to form regions free of diamond and regions of diamond seeds. Furthermore, the method comprises growing diamond in the regions of diamond seeds forming regions of diamond.

In a further embodiment of the present invention, a method for incorporating semiconductors on a diamond substrate comprises dispersing photoresist in regions on a substrate. The method further comprises exposing the photoresist to ultraviolet radiation to develop thereby forming exposed regions on the substrate. The method additionally comprises etching the exposed regions on the substrate forming recessed regions of the substrate. Furthermore, the method comprises dispersing diamond seed mixed with photoresist on the substrate including the recessed regions of the substrate. Additionally, the method comprises etching the diamond seed mixed with photoresist in non-recessed regions of the substrate forming diamond seeding regions in the recessed regions of the substrate. In addition, the method comprises growing diamond in the diamond seeding regions forming regions of diamond on the substrate.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIGS. 8A-8C illustrate focus ion beam (FIB) cross section SEM images taken from the fully coalesced epitaxial lateral overgrowth (ELOG) region of the wafer grown with P=100 Torr, T=1030° C. and V/III=7880 (mask orientation [1$\bar{1}$00]) in accordance with an embodiment of the present invention;

DETAILED DESCRIPTION

Figure 1:
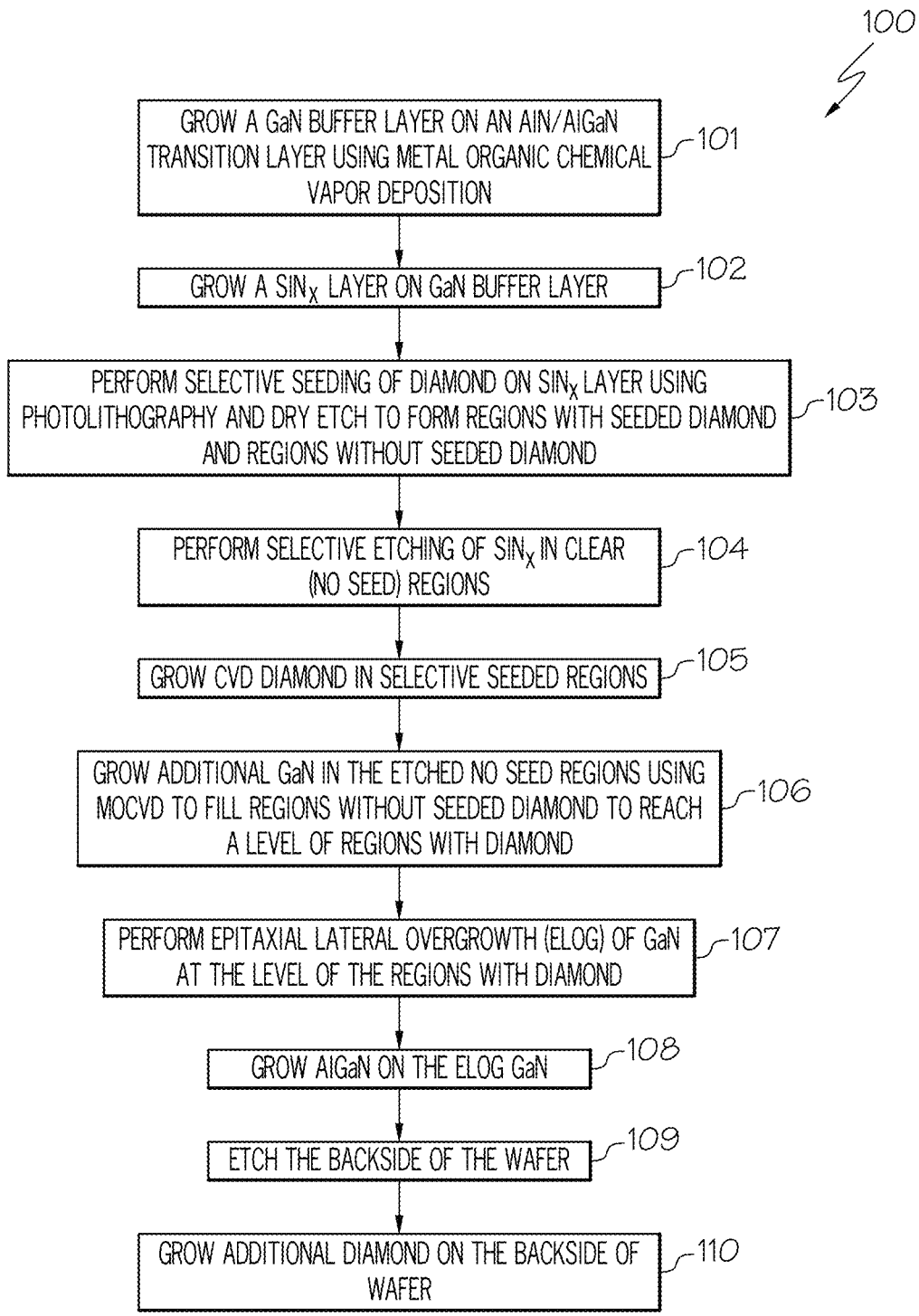
FIG. 1 is a flowchart of a method for growing crystalline gallium nitride (GaN) on a polycrystalline CVD diamond substrate in accordance with an embodiment of the present invention.

The techniques for fabricating GaN-on-diamond (or generally semiconductor-on-diamond) wafers and devices disclosed in the scientific literature and patents involve wafer transfer. In wafer transfer methods, a layer of semiconductor is grown on a silicon (Si), silicon carbide (SiC) or sapphire substrate (as examples) and then transferred to a CVD grown diamond wafer. Both carrier wafers (for diamond and semiconductor) are removed mechanically and/or chemically. Most methods involve wafer bonding using a dielectric adhesion layer and/or a dielectric layer with poor thermal conductivity, which degrades the overall thermal properties of the resulting semiconductor-on-diamond wafer.

The present invention addresses such deficiencies via a technique for directly growing device material on and/or in direct contact with a diamond substrate resulting in a simpler fabrication process than current fabrication processes. Furthermore, the present invention avoids wafer bonding involving a low thermally conductive dielectric layer thereby resulting in superior thermal conductivity.

Direct growth of device quality crystalline GaN on a polycrystalline diamond substrate is generally considered impossible due to non-crystallinity and significant lattice mismatch. Although epitaxial lateral growth of GaN on amorphous mask windows has been reported, no record of using diamond as the window mask has been published. Diamond is an attractive substrate material candidate for III-nitride semiconductor growth (or generally semiconductor growth) but the challenge of growing GaN on polycrystalline diamond is currently limiting commercial viability. In the published techniques, GaN and diamond are grown separately and then attached together. However, as discussed above, such a technique results in poor thermal performance.

Additionally, selective growth of diamond is still a challenge and research in this field is mainly focused on diamond-based electronic devices. The present invention takes advantage of three different technologies, namely, AlGaN/GaN (or generally semiconductor) growth on a substrate, epitaxial lateral growth of a nitride semiconductor with a non-crystalline mask and selective deposition of CVD diamond. These three techniques have unique applications in three different fields and the combination of them results in a simple and effective solution to the complex fabrication of GaN-on-diamond wafers (or generally semiconductor-on-diamond wafers).

While the following discusses the present invention in connection with thermal management of GaN-based electronic devices, such as in high power transistors, the principles of the present invention may be utilized in any electronic and optoelectronic devices, such as III-nitride LED, lasers, etc., as well as III-oxide, III-arsenide, III-phosphide, III-antimonide, II-VI, Si, Ge, among other semiconductor materials, where thermal management is crucial, such as for reliability. A person of ordinary skill in the art would be capable of applying the principles of the present invention to such implementations. Further, embodiments applying the principles of the present invention to such implementations would fall within the scope of the present invention.

Referring now to the Figures in detail, FIG. 1 is a flowchart of a method for growing crystalline gallium nitride (GaN) on a polycrystalline CVD diamond substrate in accordance with an embodiment of the present invention. FIGS. 2A-2H depict the cross-sectional views for growing crystalline GaN on a polycrystalline CVD diamond substrate using the steps described in FIG. 1 in accordance with an embodiment of the present invention.

While the following discusses particular semiconductor materials and alloys in growing crystalline GaN on a polycrystalline CVD diamond substrate, it is noted that the present invention is not limited to the use of such materials. For example, any Group III semiconductor material or semiconductor alloy containing Group III semiconductor material may be used as buffer layer 203, transition layer 202, etc. for growing III-nitride semiconductor material on a diamond substrate. As used herein, Group III semiconductor material refers to any semiconductor that includes element(s) from old Group III (new group 13) of the periodic table, such as boron, aluminum, gallium, indium, and thallium. Furthermore, any substrate may replace the silicon (Si) substrate 201 such that the material fabrication is benefited, such as a GaAs substrate for III-arsenide semiconductor material. A person of ordinary skill in the art would be capable of applying the principles of the present invention to such implementations. Further, embodiments applying the principles of the present invention to such implementations would fall within the scope of the present invention.

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

Figure 2B:
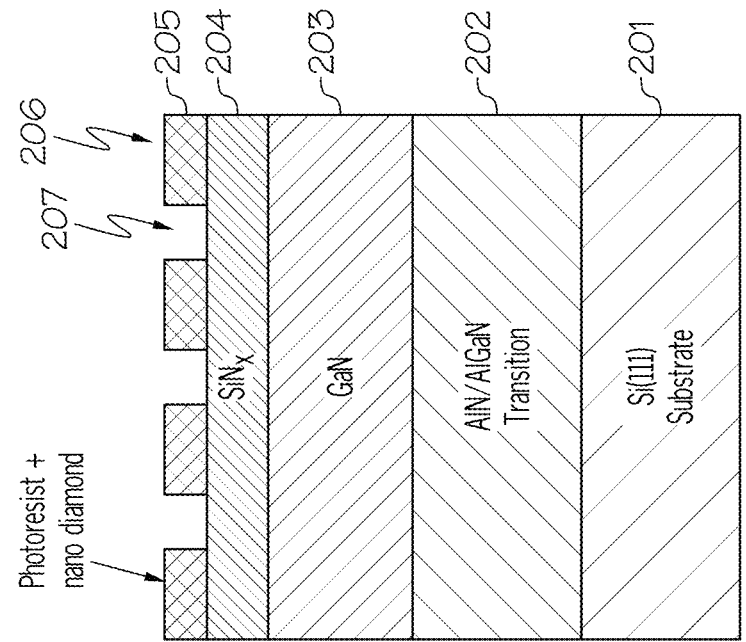
FIGS. 2A-2H depict the cross-sectional views for growing crystalline GaN on a polycrystalline CVD diamond substrate using the steps described in FIG. 1 in accordance with an embodiment of the present invention.
Figure 2A:
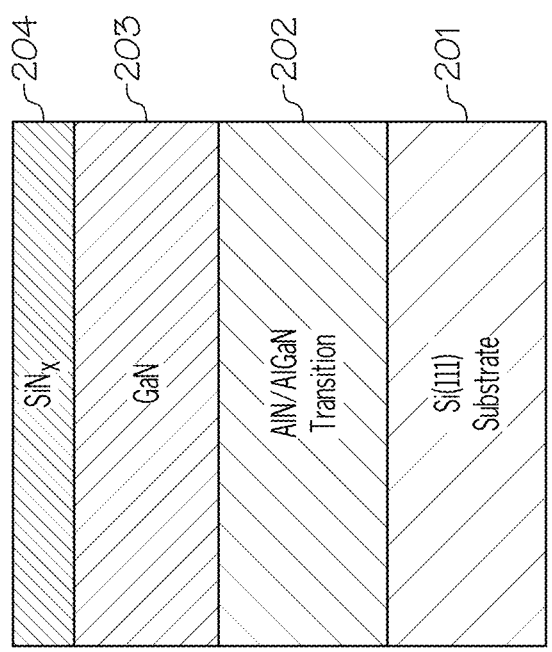

Referring now to FIG. 1, in conjunction with FIGS. 2A-2H, in step 101, a GaN buffer layer 203 is grown on an AlN/AlGaN transition layer 202 residing on a substrate 201 using metal organic chemical vapor deposition (MOCVD) as shown in FIG. 2A. As shown in FIG. 2A, in one embodiment, a GaN (gallium nitride) layer 203 is grown on AlN/AlGaN transition layer 202 (e.g., layers of AlGaN transition layer (TL)2, AlGaN TL1 and AlN) using MOCVD, which resides on a silicon (Si) substrate 201 (e.g., Si(111) surface).

While the discussion focuses on MOCVD crystalline GaN on a polycrystalline CVD grown diamond substrate, it is noted that the present invention is not limited to the use of said growth techniques. For example, any growth technique for growing III-nitride semiconductors and diamond may be utilized, including, but not limited to, molecular beam epitaxy, halide vapor phase epitaxy, liquid phase epitaxy, and atomic layer deposition. A person of ordinary skill in the art would be capable of applying the principles of the present invention to such implementations. Further, embodiments applying the principles of the present invention to such implementations would fall within the scope of the present invention.

In step 102, a $SiN_x$ (silicon nitride) layer 204 is grown on GaN buffer layer 203, such as via MOCVD, plasma-enhanced CVD (PECVD), or low-pressure CVD (LPCVD), as shown in FIG. 2A. In one embodiment, the thickness of $SiN_x$ layer 204 is approximately 100 nm. In a preferred embodiment, the thickness of the $SiN_x$ layer 204 is approximately 50 nm.

In one embodiment, due to high lattice mismatch between Si and GaN, crystalline GaN 203 growth on Si 201 is assisted by growing lower lattice mismatched transition layers 202 at first with the subsequent GaN buffer layer 203. The thick buffer layer ensures reduced dislocation defect density in the epitaxial layer which is beneficial for high electron mobility in HEMT devices. Growing AlGaN/GaN HEMT is an established technique and such devices are commercially available. The growth process in the present invention starts with a similar growth strategy as AlGaN/GaN HEMT without the top device layer. At first, an AlN nucleation layer is grown. In one embodiment, the thickness for the AlN layer may be approximately 400 nm. Two AlGaN transition layers are grown on the AlN layer with 50 at. % and 26 at. % Al in AlGaN, respectively. These transition layers significantly reduce the lattice mismatch strain of GaN. More specifically, transition layer 1 with 50 at. % Al functions as a transition layer and the layer with 26 at. % Al functions as an intermediate layer between the transition layer 1 and GaN buffer layer 203. Here, III-nitride layers 202 function as a strain absorbing layer. In one embodiment, the GaN buffer layer has an approximate thickness of 850 nm.

In one embodiment, the wafer is taken out from the MOCVD chamber after growing GaN buffer layer 203 and $SiN_x$ layer 204 is grown ex-situ or an in-situ $SiN_x$ layer 204 can be grown in the MOCVD chamber. In one embodiment, the in-situ $SiN_x$ layer thickness is approximately 100 nm. In a preferred embodiment, the thickness of the $SiN_x$ layer 204 is approximately 50 nm. In-situ growth of $SiN_x$ may be preferred because an in-situ deposited thin layer of amorphous $SiN_x$ works as a diffusion barrier and passivation material. Such a film would keep GaN layer 203 protected from being exposed to the environment. If, however, in-situ $SiN_x$ growth is not available, PECVD or LPCVD can also be used to deposit the $SiN_x$ layer 204. The thin $SiN_x$ layer 204 may work as a nucleation surface for diamond seeding since diamonds usually do not nucleate very well on a GaN surface. Furthermore, the $SiN_x$ layer 204 protects the GaN surface 203 during subsequent diamond growth process where an excessive amount of hydrogen is used and the GaN surface may decompose in such an environment. Another important property of the $SiN_x$ layer 204 is its use as a mask for diamond seeding. While any material may be used for layer 204 that enables selective seeding of diamond, a $SiN_x$ mask enhances the selectivity of the diamond seed.

In step 103, selective seeding of diamond 205 on $SiN_x$ layer 204 is performed using photolithography and dry etching to form regions 206 with seeded diamond and regions 207 without seeded diamond as shown in FIG. 2B.

In one embodiment, standard photolithography techniques are used to selectively seed the wafer with diamond

Figure 3:
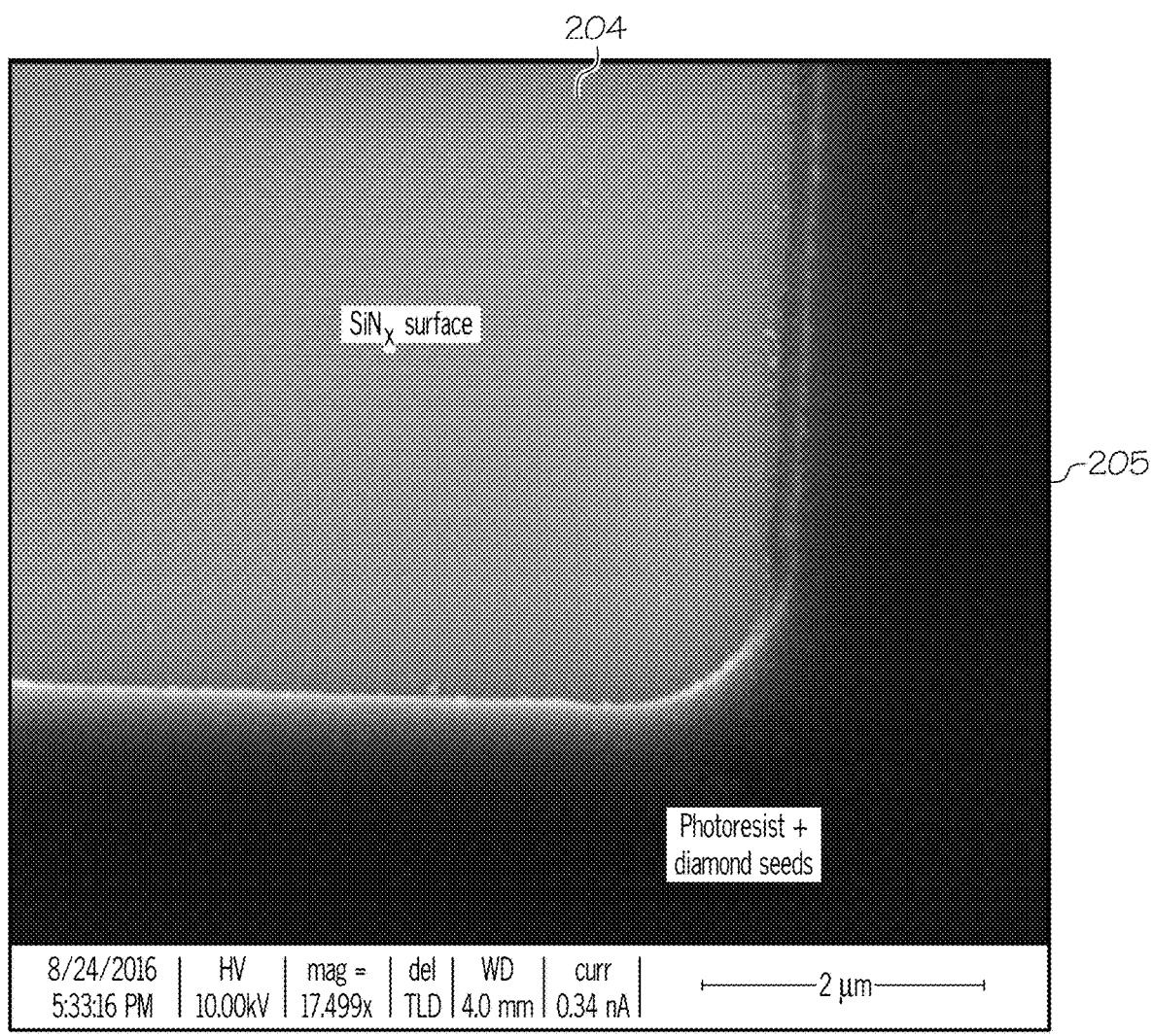
FIG. 3 illustrates a top view scanning electron microscopy (SEM) image of the selectively seeded wafer in accordance with an embodiment of the present invention.

205. In one embodiment, the seeding process starts with mixing a diamond solution (e.g., nano-diamond) with photoresist. In one embodiment, diamond particles with a size distribution of 4-20 nm are suspended in dimethyl sulfoxide (DMSO), where the typical concentration is 0.05 wt. % solution. In one embodiment, the photoresist used was S1813. However, any photoresist can also be used. In one embodiment, the volume ratio of the DMSO based diamond suspension in S1813 was 2 to 3, i.e., 1 mL of nano-diamond suspension and 1 mL DMSO in 3 mL S1813. Such a solution is then placed in an ultrasonic bath for 20 minutes in a high sonication mode. This step would break any diamond seed clusters and form a uniform distribution of diamond particles in the solution. The solution may then be pre-heated at 115° C. for 90 seconds. Simultaneously, the $SiN_x$ coated wafer (entire structure of FIG. 2A) from the previous step is cleaned with acetone, methanol and isopropyl alcohol in a spin coater and then baked at 115° C. for 30 seconds. The pre-heated photoresist containing diamond 205 may then be statically dispensed on the wafer with the spinner running at a spin speed of approximately 2500 rpm for 30 seconds. The photoresist film thickness after this step is found to be approximately 500 nm which may be too thin for ultraviolet (UV) exposure depending on the type of immersion scanner utilized. In one embodiment, the wafer may then be soft baked at 115° C. for 30 seconds. Another layer of thicker photoresist (S1813) is deposited on top of the previously deposited photoresist and the resultant final thickness of the photoresist layer is approximately 1400-1500 nm. After UV exposure in a contact aligner, the exposed regions are developed with a Microposit® MF CD-26 developer. In one embodiment, a deionized water rinse at a spin speed of 4500 rpm is performed to clear the developed regions from the wafer. At this stage, the majority of the diamond containing photoresist 205 will be cleared from the exposed regions. The feature sizes may range from 0.1 to 1,000 micrometers (smaller and larger feature sizes are viable depending on the size of the diamond seed and wavelength of the scanner instrument). FIG. 3 illustrates a top view scanning electron microscopy (SEM) image of the selectively seeded wafer in accordance with an embodiment of the present invention.

Figure 2D:
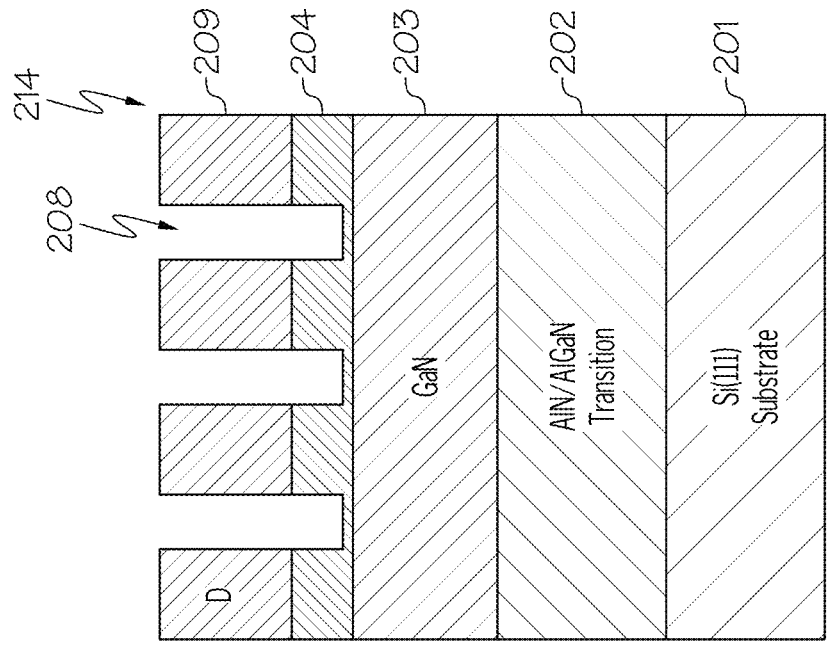
Figure 2C:
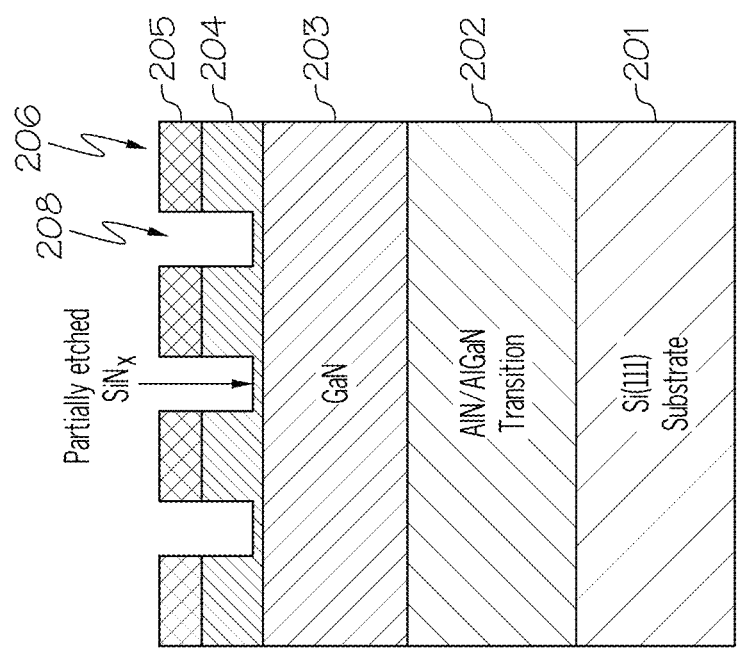

In step 104, selective etching of $SiN_x$ 204 is performed in clear (no seed) regions (regions 207 without seeded nano-diamond) forming etched regions 208 without seeded nano-diamond as shown in FIG. 2C.

In one embodiment, to achieve selectivity and to clear remaining seeds from the exposed regions, the wafer is plasma etched in a reactive ion etching (RIE) chamber. In one embodiment, the RIE and inductive coupled plasma (ICP) powers used were 100 W and 1000 W, respectively, and the chamber pressure was 20 mTorr. In one embodiment, a mixture of 45 sccm of $C_4F_8$ and 5 sccm of $O_2$ was used as etching reagents. This etching process effectively removed diamond seeds and $SiN_x$ layer 204 partially. In one embodiment, the etching process stopped after 60-70 nm of $SiN_x$ etching which leaves 30-40 nm of $SiN_x$ layer 204 above GaN buffer layer 203. This thin $SiN_x$ layer 204 acts as protective layer during the CVD of diamond.

In step 105, CVD diamond is grown in selective seeded regions 206 (regions 206 with seeded diamond) forming regions of diamond 209 (indicated as "D" in FIG. 2D) as shown in FIGS. 2C and 2D.

In one embodiment, the etched wafer from step 104 is directly loaded in a hot filament CVD diamond chamber for growth of diamond 209 in the selectively seeded regions 206. In one embodiment, polycrystalline diamond film 209 is deposited on the substrate due to the vapor phase chemical reaction among oxygen, methane and hydrogen at a temperature of 720-750° C. and a pressure of 20 Torr. In one embodiment, the flow rate for hydrogen is 2 slm; for methane, 30 standard cubic centimeters per minute (sccm) (1.5% of methane); and for oxygen, the rate is 3 sccm. However, the gas flow rate and growth conditions can be changed to modify the growth rate of diamond. In one embodiment, the best quality diamond is grown with 1-3% methane in hydrogen. As used herein, the "quality" of diamond refers to the percentage of $sp^3$ bonded carbon in diamond. $sp^2$ content in diamond usually has very poor thermal conductivity and is not expected in the present invention. However, a certain percentage of non-diamond carbon (e.g., $sp^2$ bonded carbon) may result in hot filament CVD (HFCVD) grown polycrystalline diamond film. In one embodiment, high quality diamond was achieved with methane concentration up to 4.5% due to the higher power regime of the reactor. A discussion on methane concentration and diamond quality is discussed further below. The growth rate of diamond varies with growth condition. In one embodiment, an approximate 500 nm thick diamond layer 209 was selectively grown on the patterned seeded wafer.

The diamond film at this point may be rough with a root mean square (RMS) roughness above 100 nm. In one embodiment, such a rough surface can be planarized using chemical mechanical polishing (CMP). An alternative embodiment of reducing roughness of the diamond surface is using a higher methane concentration. FIGS. 4A-4D illustrate SEM images of the selectively deposited diamond stripes on the thin $SiN_x$ surface 204 on GaN layer 203 in accordance with an embodiment of the present invention.

Figure 4B:
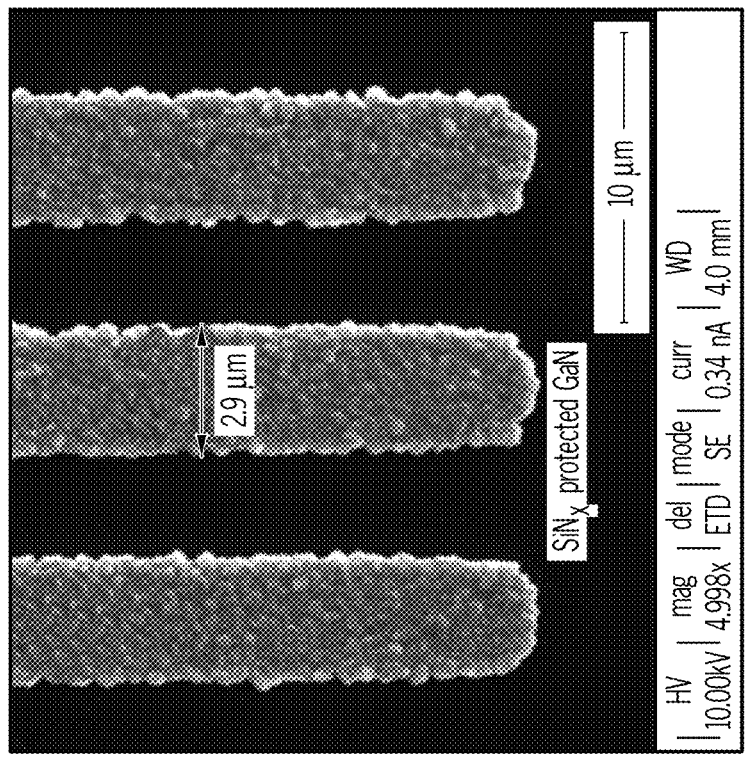
FIGS. 4A-4D illustrate SEM images of the selectively deposited diamond stripes on the thin $SiN_x$ surface on the GaN layer in accordance with an embodiment of the present invention.
Figure 4A:
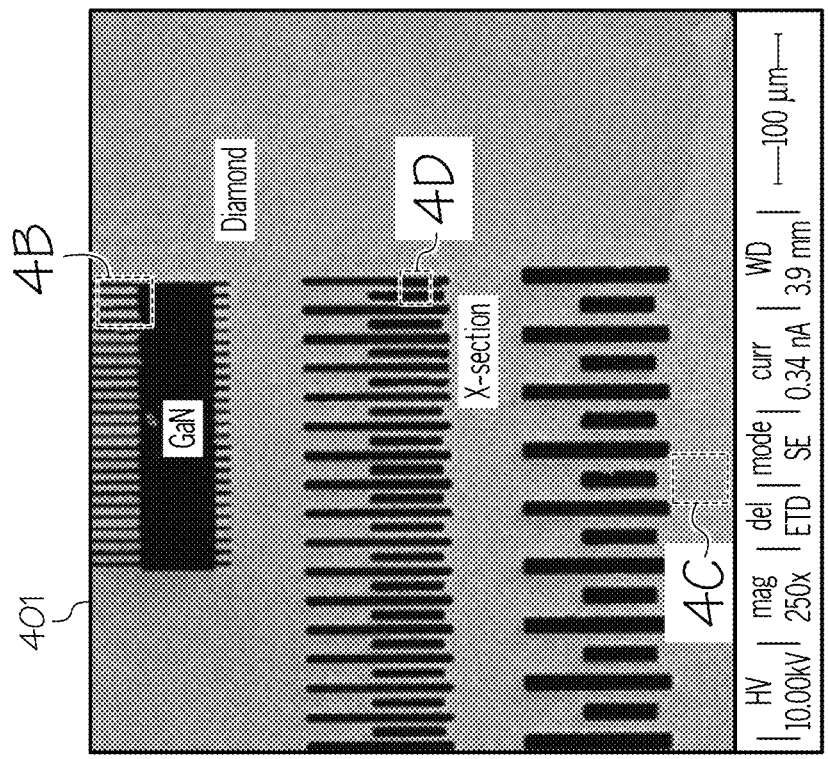
Figures 4C, 4D:
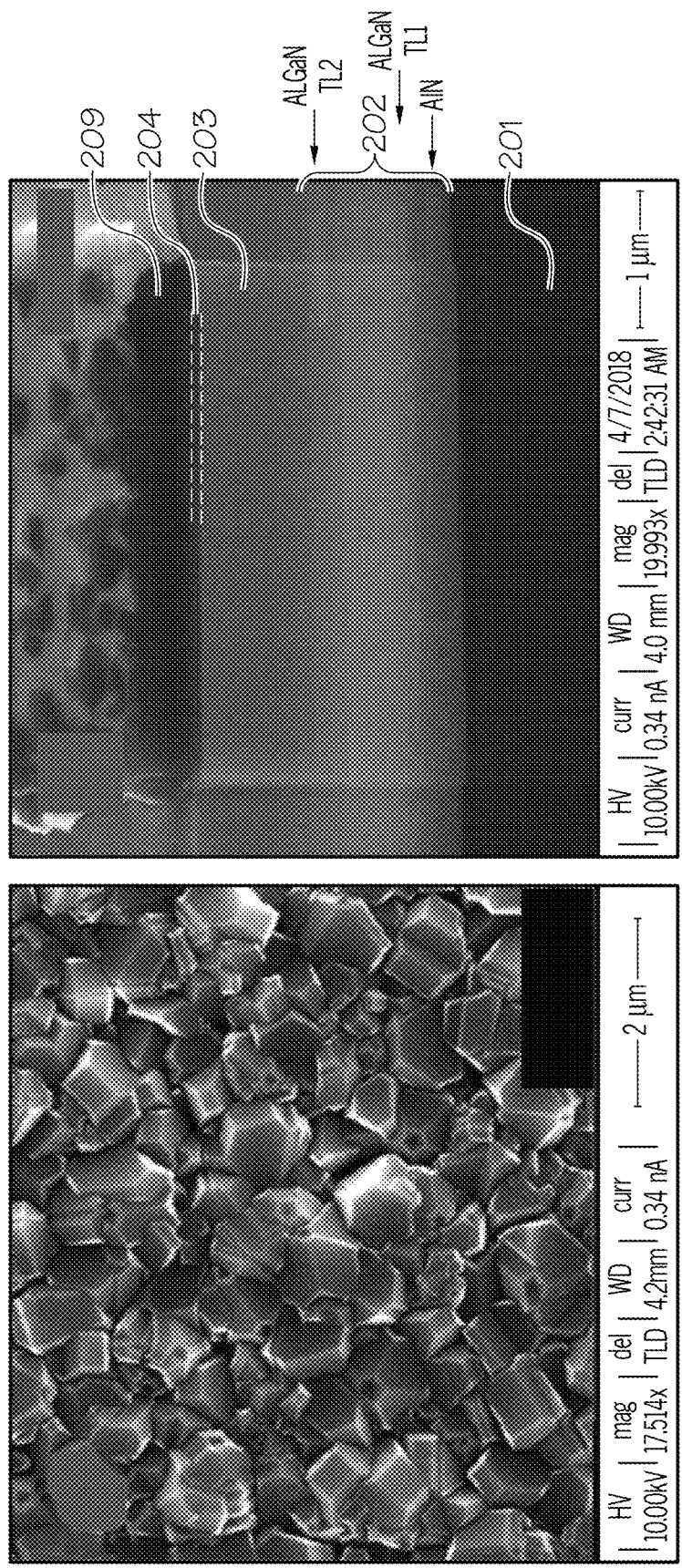

A representative plane view of the wafer 401 (represents the entirety of FIG. 2D) after diamond deposition is shown in FIG. 4A. The SEM image of FIG. 4A shows excellent selectivity of the III-nitride wafer after diamond deposition. FIG. 4B is an SEM image showing a magnified view of the boxed region in FIG. 4A indicating 2.9 μm wide diamond fingers. FIG. 4C is an SEM image showing a magnified view of the diamond region of FIG. 4A exhibiting complete coverage of the $SiN_x$ layer 204 with polycrystalline diamond 209. FIG. 4D is an SEM image showing the focused ion beam (FIB) cross section of the boxed region in FIG. 4A indicating that the III-nitride semiconductor layers (layers 202 and 203) are protected by $SiN_x$ layer 204.

Figure 5B:
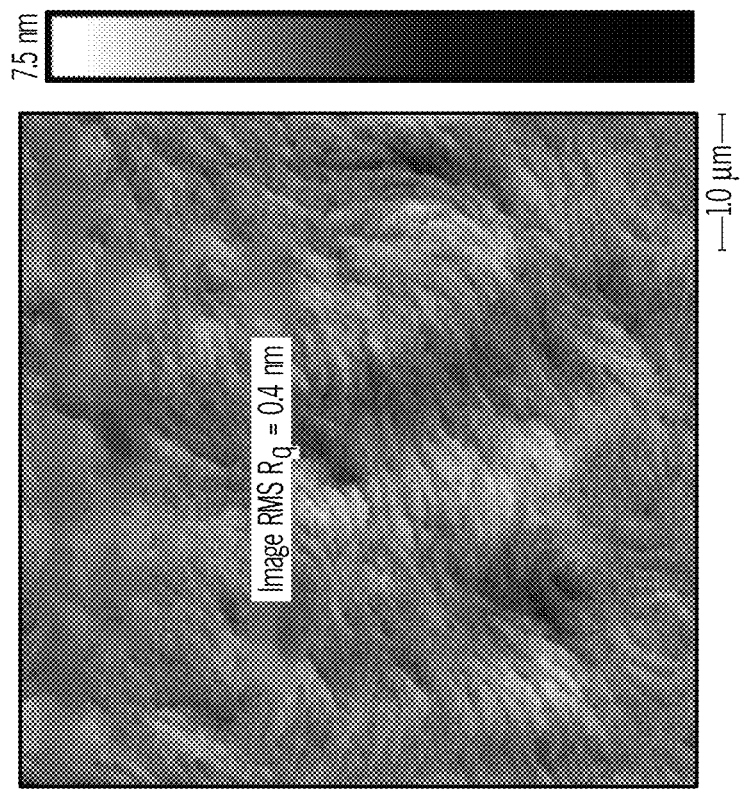
FIG. 5B is an AFM image of the GaN buffer layer surface after diamond deposition and reactive ion etching in accordance with an embodiment of the present invention.
Figure 5A:
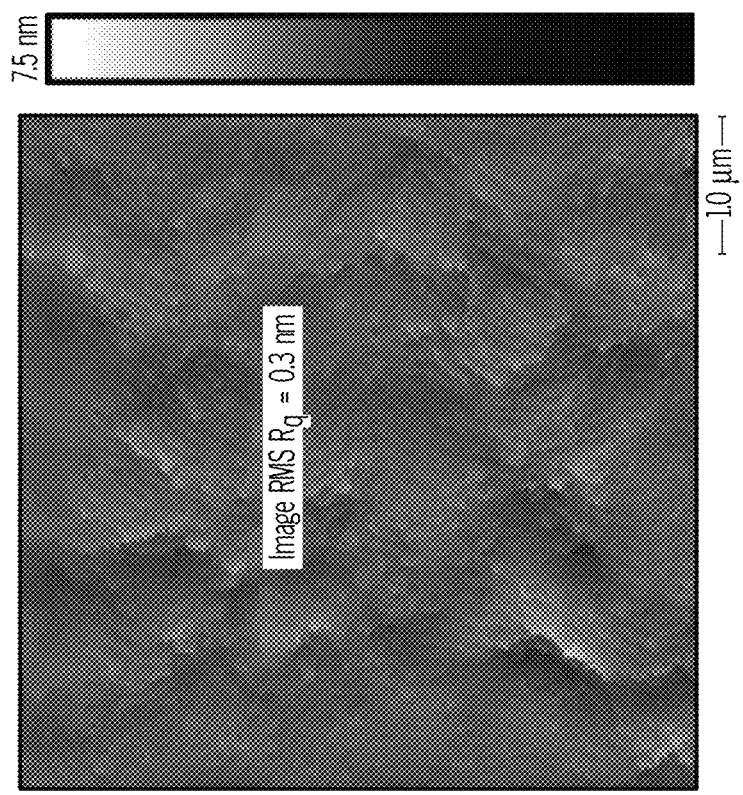
FIG. 5A is an atomic force microscopy (AFM) image of the GaN buffer layer surface before processing and diamond deposition in accordance with an embodiment of the present invention.

The protection of the III-nitride semiconductor layers (layers 202 and 203) during the CVD process was confirmed from atomic force microscopy (AFM) images taken of the GaN buffer layer 203 surface before diamond deposition as shown in FIG. 5A and after diamond deposition and reactive ion etching on open region 208 as shown in FIG. 5B in accordance with an embodiment of the present invention. The reactive ion etching after selective diamond deposition is performed to access the GaN buffer layer 203 surface that was covered by the remaining $SiN_x$ layer 204 in open regions 208. In one embodiment, RIE using $SF_6$ chemistry after step 105 is performed. The $SF_6$ based RIE time is <10 seconds and with low power (50 W and 500 W for inductively coupled plasma (ICP) and reactive ion etching (RIE), respectively). FIG. 5 illustrates that there is little change in surface roughness of the GaN layer 203 surface before and after growth of diamond 209.

Figure 2F:
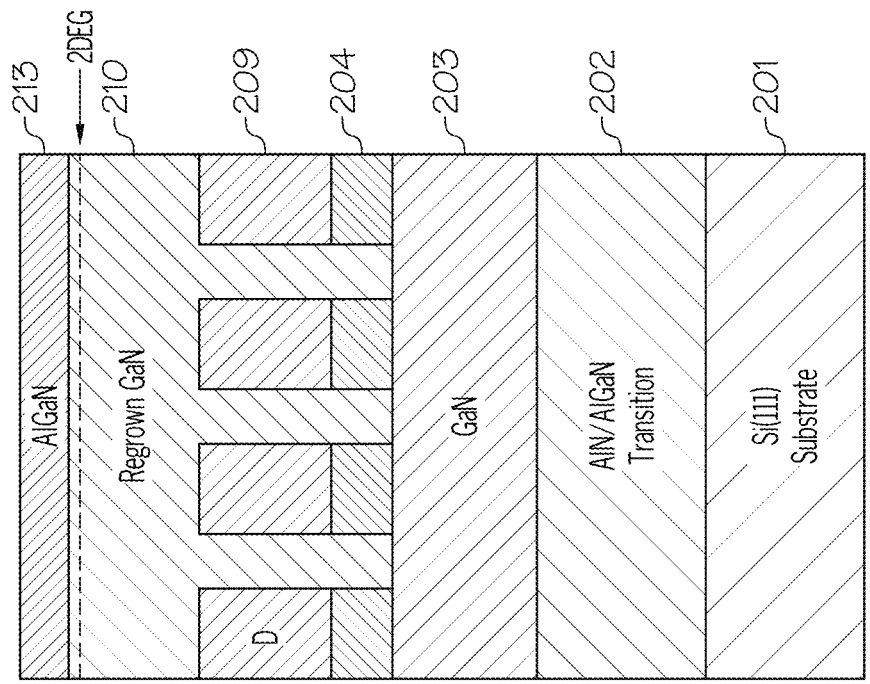
Figure 2E:
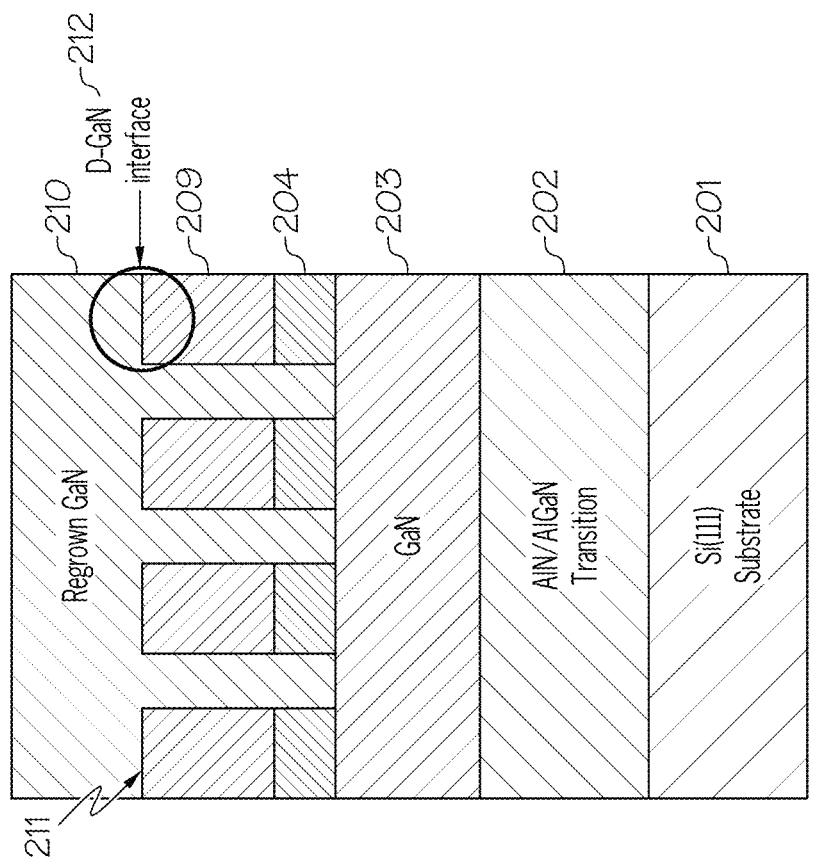

In step 106, additional GaN is grown (regrown GaN 210) in the etched regions 208 without seeded diamond to fill such regions to reach the level of the regions 211 with diamond as shown in FIGS. 2D and 2E, such as by using MOCVD. In step 107, epitaxial lateral overgrowth (ELOG) of GaN (regrown GaN 210) is performed as shown in FIG.

2E. That is, ELOG of GaN 210 is performed at and above the level of the regions 211 with diamond (D-GaN interface 212) as shown in FIG. 2E.

In one embodiment, the wafer is then placed in a MOCVD chamber after step 105. Initially, regrown GaN 210 is grown at a high growth rate to fill the windows. In one embodiment, a higher growth rate can be achieved using lower group V/III molar ratio (V/III) or higher pressure. After growing regrown GaN 210 to a thickness of 800 nm, the growth rate is reduced and enhanced lateral growth is achieved using higher V/III molar ratio and lower pressure. In one embodiment, higher temperature is employed to enhance lateral growth. The process of lateral growth of regrown GaN 210 is an established technique and known as "epitaxial lateral overgrowth" (ELOG). A higher quality GaN crystal with lower defect density can be grown using ELOG. During ELOG, regrown GaN 210 may grow over the entire wafer leaving underneath diamond in some regions. FIG. 2E depicts the schematic of the structure after performing ELOG.

Figures 6A, 6B:
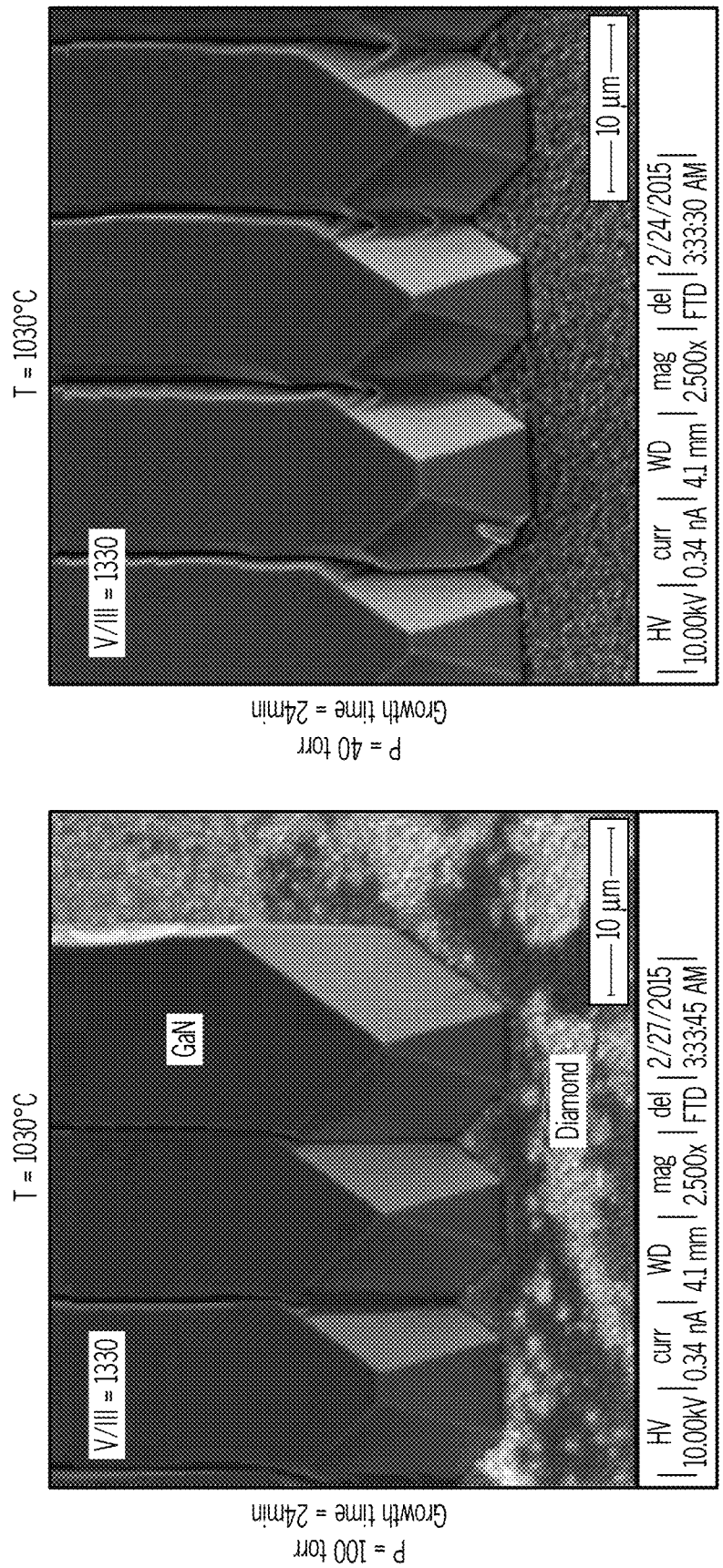
FIGS. 6A-6D illustrate SEM images of wafers on which four experiments were conducted for achieving full coalescence of regrown GaN in accordance with an embodiment of the present invention.
Figure 6D:
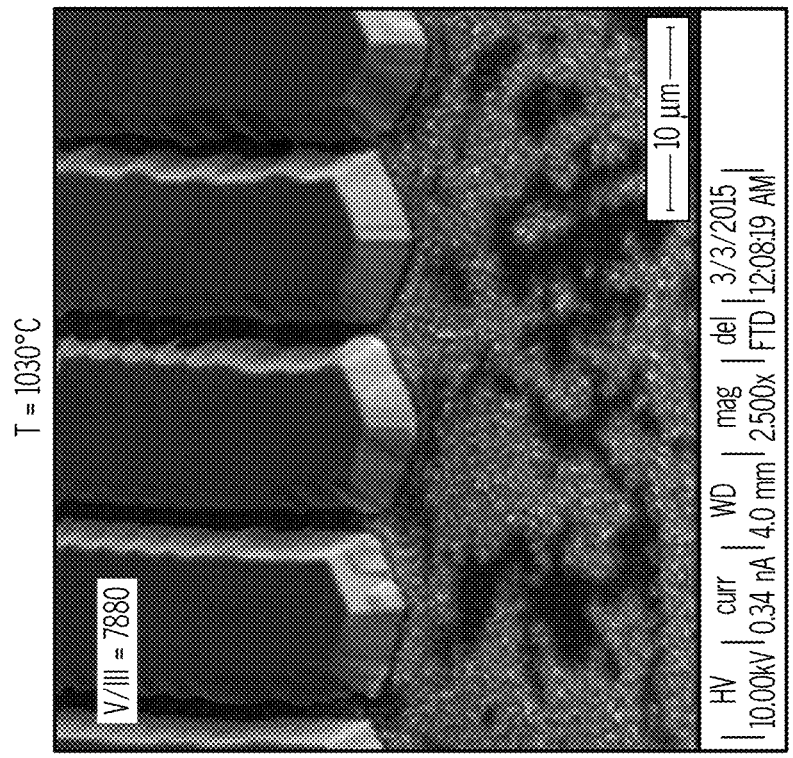
Figure 6C:
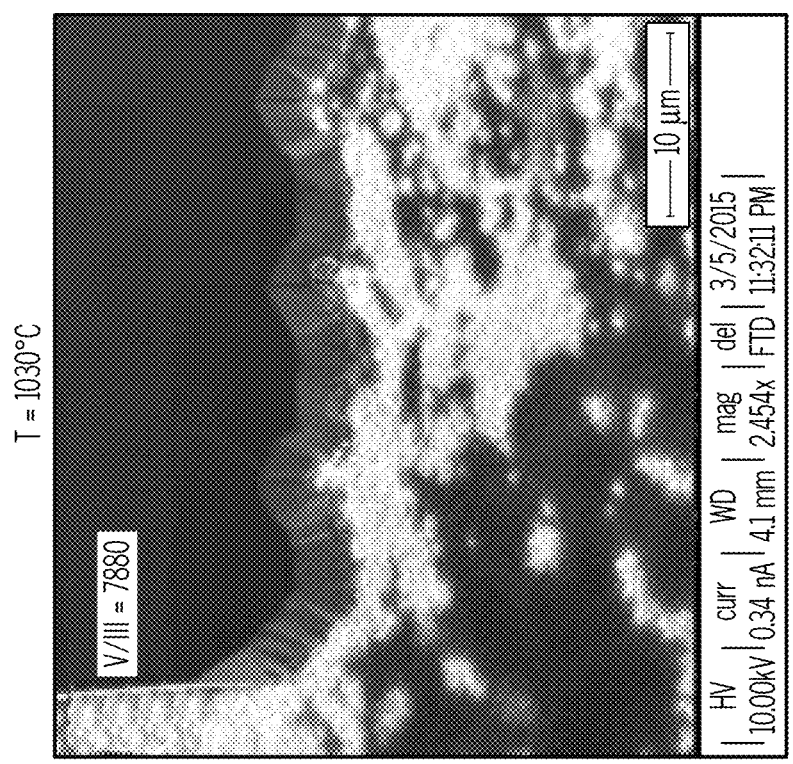

In one embodiment, full coalescence of regrown GaN 210 over diamond stripes may be realized. FIGS. 6A-6D illustrate SEM images of wafers on which four experiments were conducted for achieving full coalescence of regrown GaN 210 in accordance with an embodiment of the present invention. In FIGS. 6A and 6B, growth pressure was varied between 100 Torr and 40 Torr while keeping the V/III molar ratio at 1330. Lateral growth increased significantly in both cases while the regrown GaN 210 is not fully coalesced. In FIGS. 6C and 6D, the V/III molar ratio was increased to 7880 and the growth pressure was varied between 100 Torr and 40 Torr. After ELOG, it was confirmed that full coalescence of GaN 210 over a 5 µm wide diamond stripes between 5 µm wide GaN windows can be achieved when P=100 Torr, T=1030° C. and V/III=7880 as seen in FIG. 6C.

While one embodiment of the present invention is to achieve full coalescence of regrown GaN 210 over diamond 209, a partially coalesced regrown GaN 210 structure may be useful for certain applications, such as in optoelectronics. For example, the sidewall of GaN pyramids are good for lasing of light that is not achievable from the c-axis oriented surface or (0001) surface. Therefore, partial ELOG III-nitride structures, as shown in FIGS. 6A, 6B and 6D and FIGS. 7A-7D can be useful for, e.g., optoelectronic devices with the unique feature of diamond integrated with them.

Figures 7A, 7B:
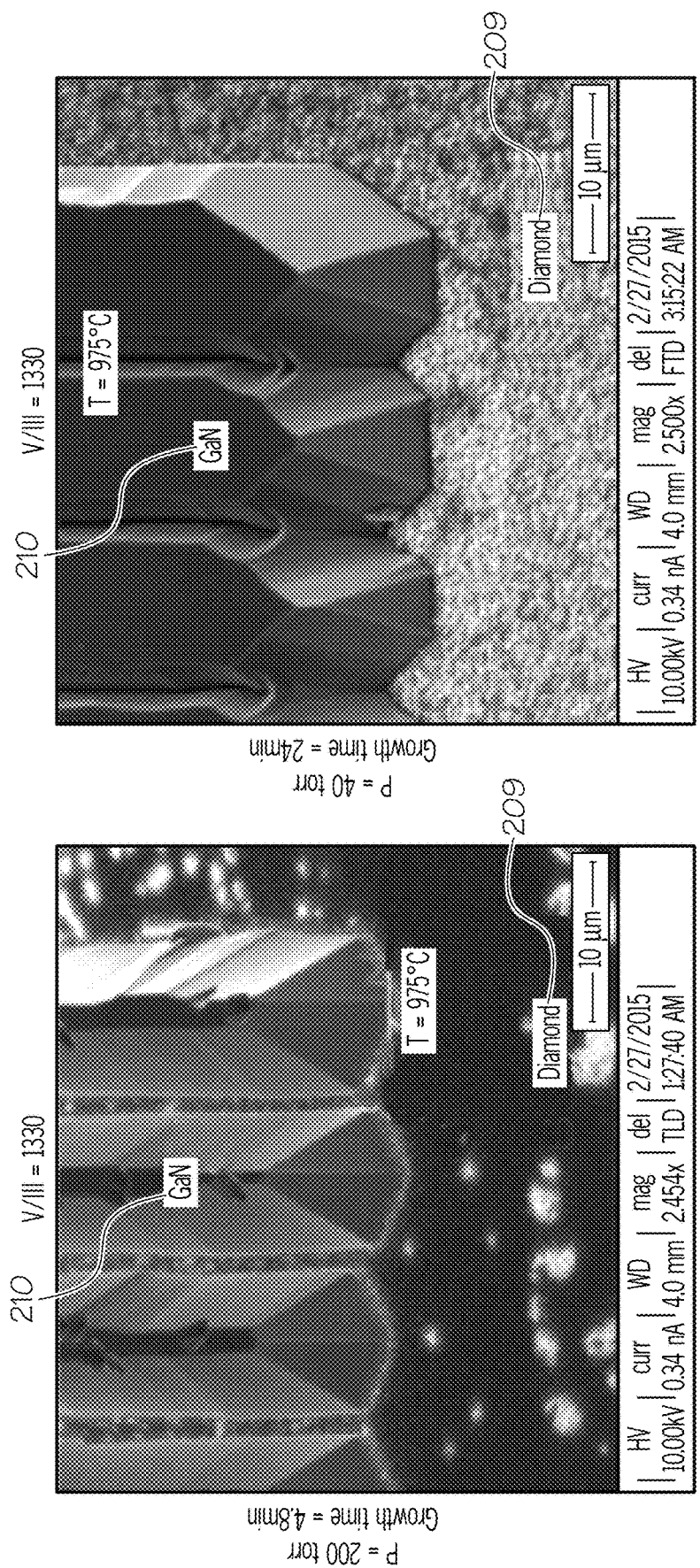
FIGS. 7A-7D are SEM images showing the effect of pressure and temperature on the lateral growth of regrown GaN for two different temperatures for V/III molar ratio 1330 in accordance with an embodiment of the present invention.
Figures 7C, 7D:
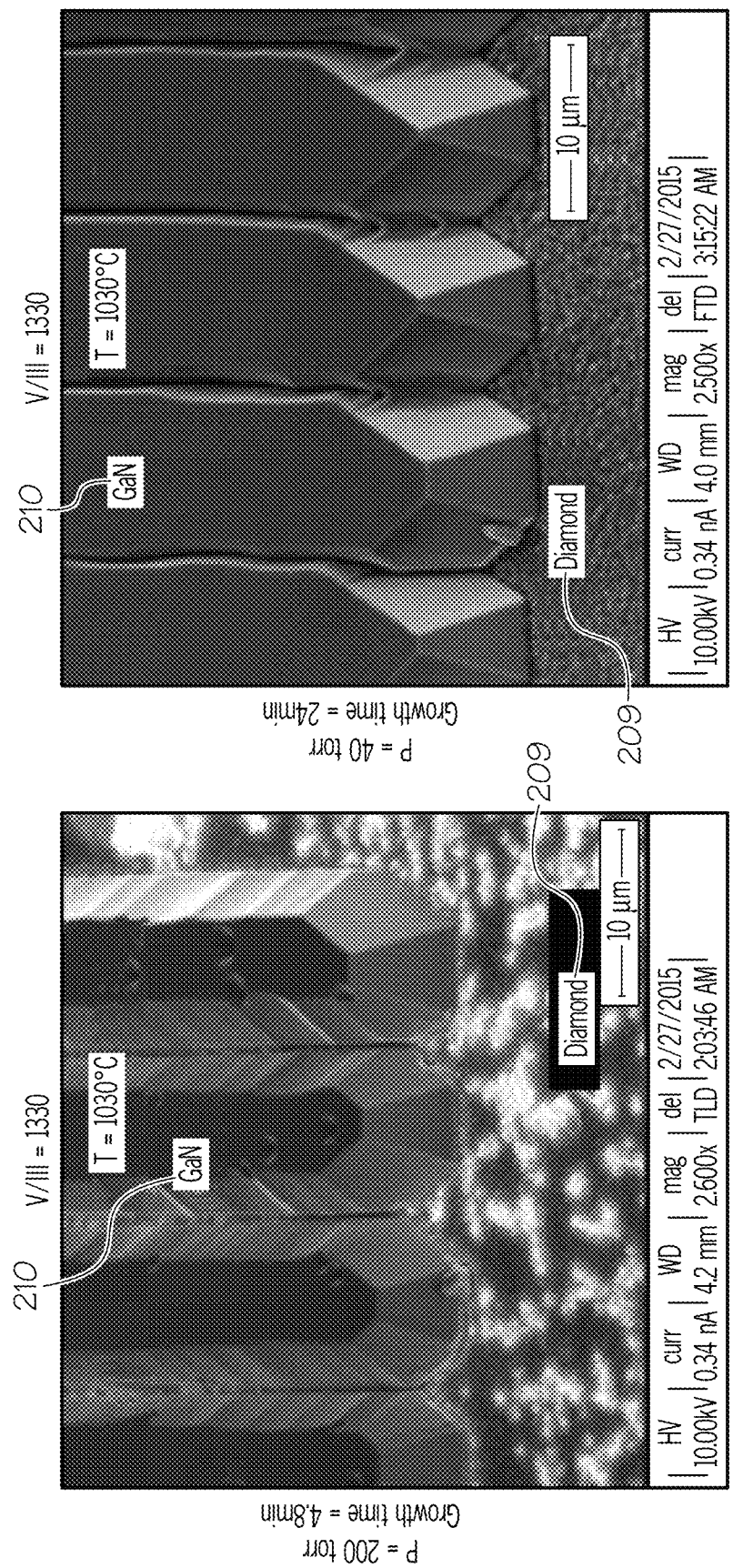

FIGS. 7A-7D are SEM images showing the effect of pressure and temperature on the lateral growth of regrown GaN 210 for two different temperatures for V/III molar ratio 1330 in accordance with an embodiment of the present invention. In FIGS. 7A and 7B, growth pressure was varied between 100 Torr and 40 Torr while keeping the growth temperature at 975° C. FIGS. 7C and 7D show similar effects of pressure when the growth temperature was 1030° C.

Figure 8C:
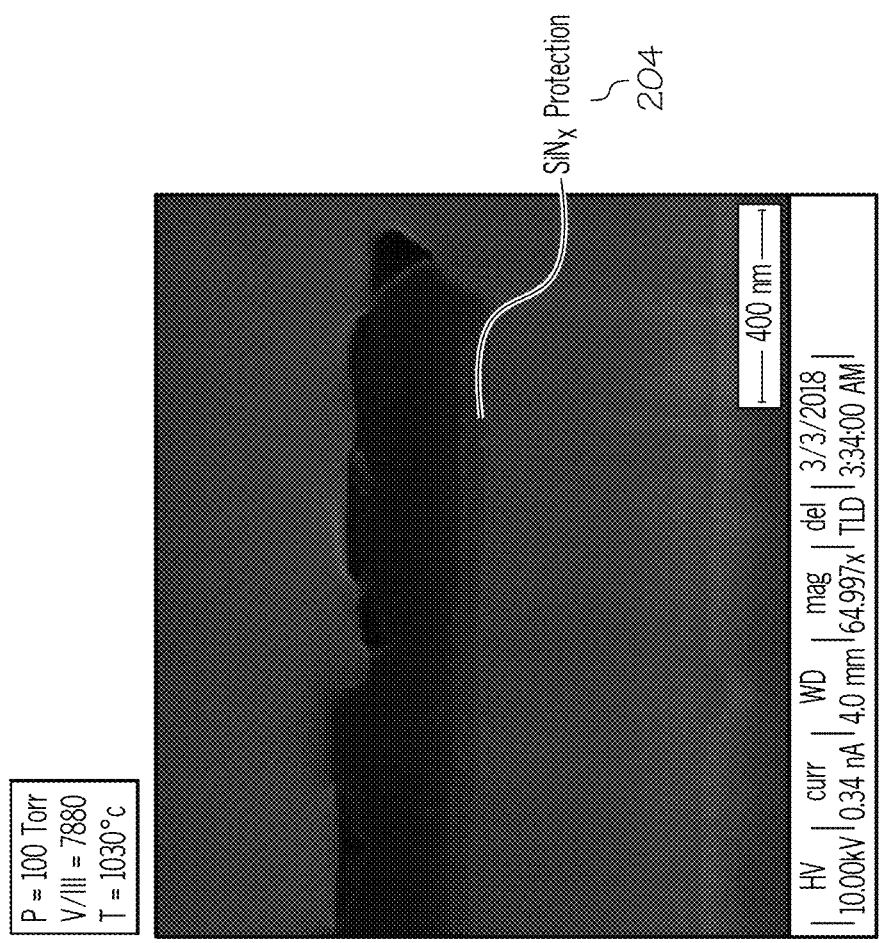

A fully coalesced region of the ELOG wafer shown in FIG. 6C was characterized in additional detail. A focus ion beam (FIB) cross section of a full coalesced region is shown in FIGS. 8A-8C. FIGS. 8A-8C illustrate FIB cross section SEM images taken from the fully coalesced ELOG region of the wafer grown with P=100 Torr, T=1030° C. and V/III=7880 (mask orientation [1$\bar{1}$00]) in accordance with an embodiment of the present invention. FIG. 8A shows the top view of the SEM image of the coalesced GaN on a 5 µm GaN window to 5 µm diamond stripe region. In FIGS. 8B and 8C, the cross section of such a structure and its magnified views are shown.

Figure 9B:
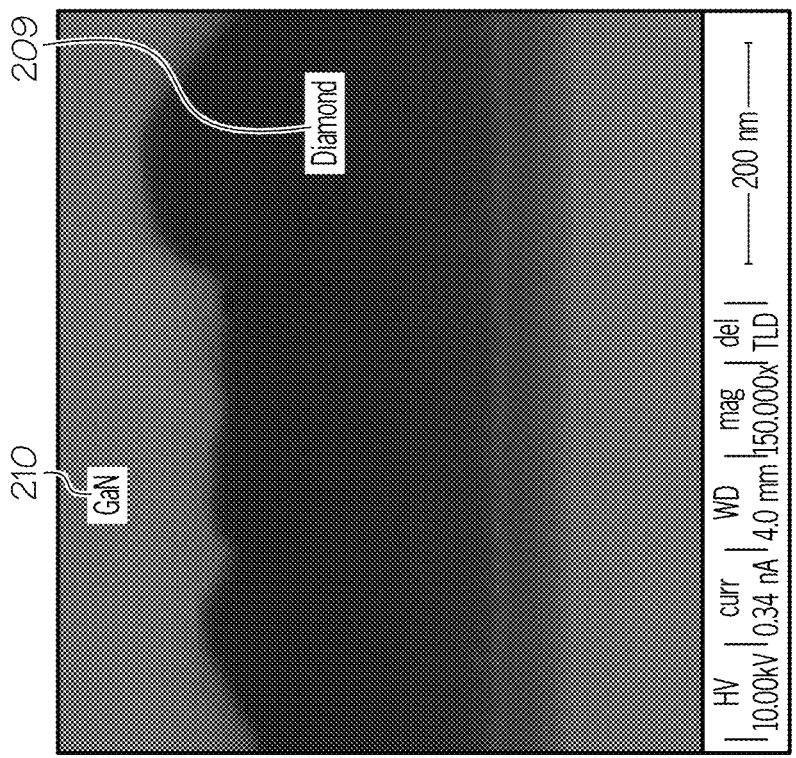
FIGS. 9A-9B illustrate FIB cross section SEM images taken from the fully coalesced ELOG region of the wafer grown with P=100 Torr, T=1030° C. and V/III=7880 (mask orientation [1$\bar{1}$00]) in accordance with an embodiment of the present invention.
Figure 9A:
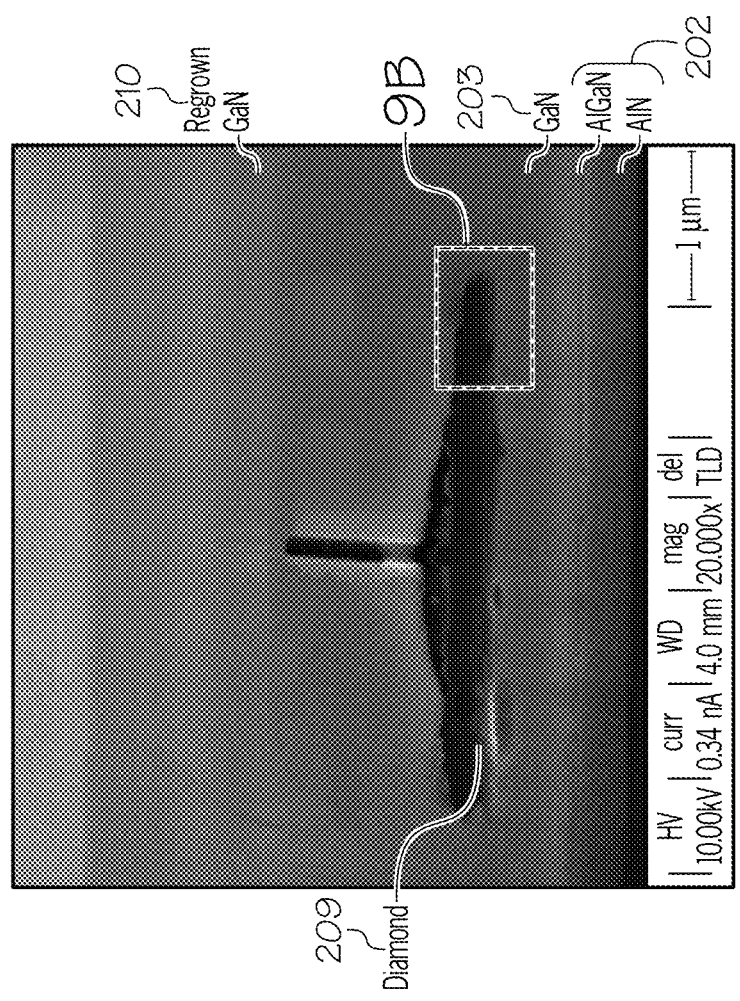

Referring to FIGS. 9A-9B, FIGS. 9A and 9B illustrate FIB cross section SEM images taken from the fully coalesced ELOG region of the wafer grown with P=100 Torr, T=1030° C. and V/III=7880 (mask orientation [1$\bar{1}$00]) in accordance with an embodiment of the present invention. FIG. 9A illustrates the dimension of the ELOG regrown GaN 210 on diamond 209 and FIG. 9B shows direct contact between GaN and diamond at the GaN-diamond interface 212.

The FIB cross section image of FIG. 9A indicates the vertical to lateral growth of ELOG GaN, where the dimensions are shown in FIG. 9A. The lateral to vertical growth was 1:1. Intimate and direct contact between GaN and diamond at the GaN-diamond interface is also shown in FIG. 9B. In one embodiment, the highest lateral growth was achieved when the GaN openings were oriented along [1$\bar{1}$00].

Figure 10A:
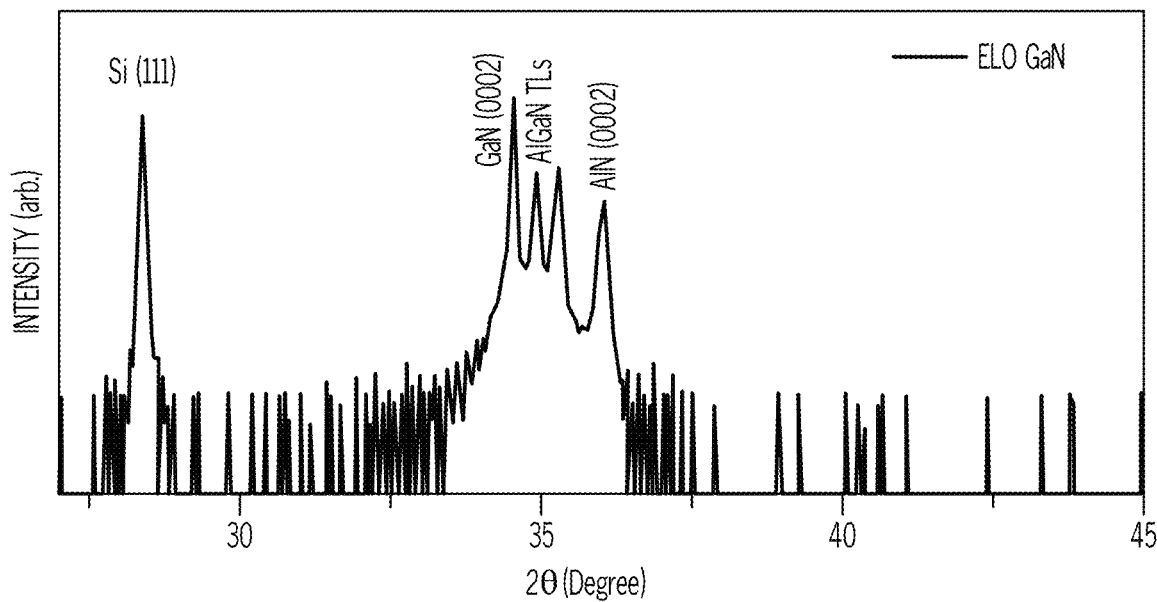
FIGS. 10A-10C illustrate the high resolution x-ray diffraction (HRXRD) spectra of the wafer grown with P=100 Torr, T=1030° C. and V/III=7880 in accordance with an embodiment of the present invention.
Figure 10B:
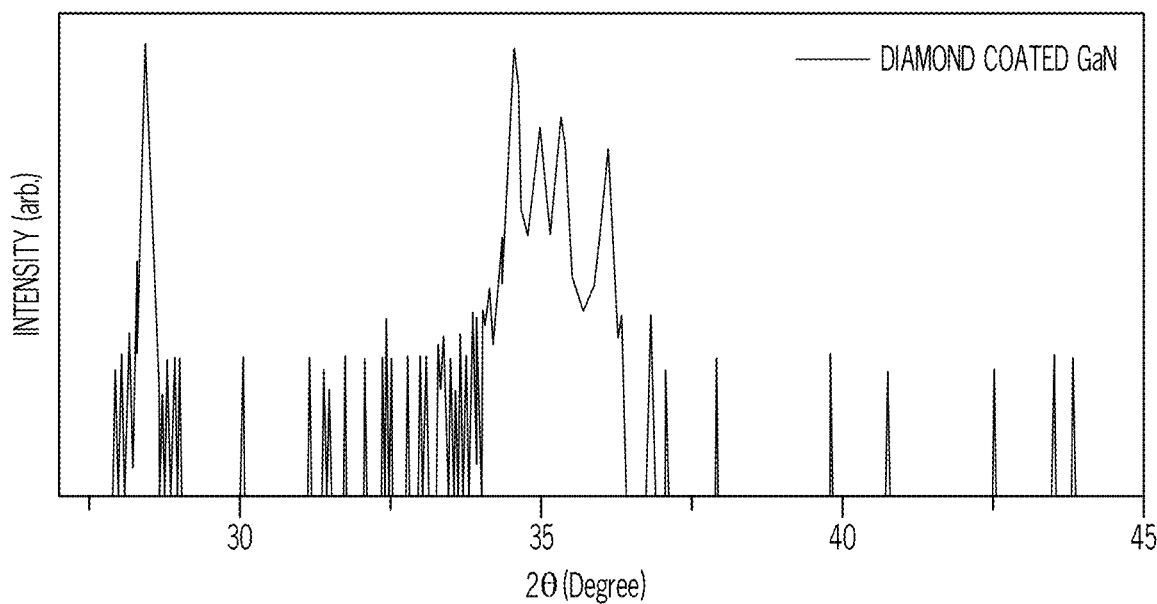
Figure 10C:
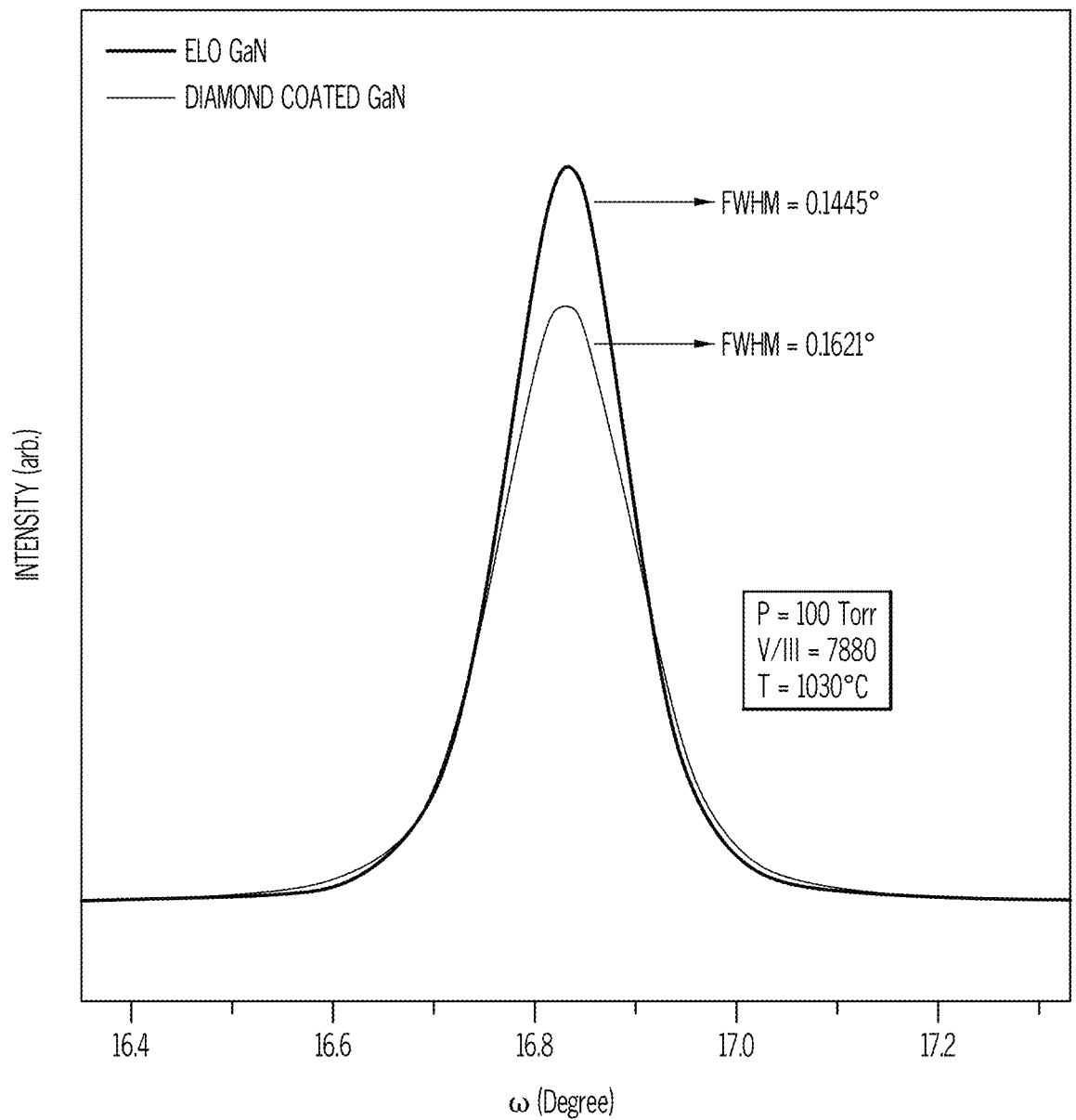

To confirm the quality of the overgrown GaN 210, high resolution x-ray diffraction (HRXRD) was performed on the ELOG region and the diamond coated region. FIGS. 10A-10C illustrate the HRXRD spectra of the wafer grown with P=100 Torr, T=1030° C. and V/III=7880 in accordance with an embodiment of the present invention. In particular, FIGS. 10A and 10B show HRXRD spectra taken from the ELOG region and the diamond coated region, respectively. Only the symmetric (0002) plane of GaN 210 was observed from XRD results and no polycrystalline peaks were visible in XRD. These data indicate that the regrown GaN 210 on the exposed region is crystalline and grows along the [0001] direction.

FIG. 10C shows the HRXRD spectra taken from the rocking curve of GaN (0002) plane reflection. The full width at half maxima (FWHM) of GaN (0002) peak as shown in FIG. 10C was 0.1445° (520 arc second) and 0.1621° (580 arc second) on the ELOG and diamond coated region, respectively. The ELOG GaN has lower FWHM than a baseline GaN-on-silicon wafer (FWHM=~0.16°) indicating better crystallinity and reduced defect density. In general, reduced FWHM of a rocking curve of any peak means more crystal planes are aligned to that specific plane and disorientations or defect density is less in the crystal.

Figure 11:
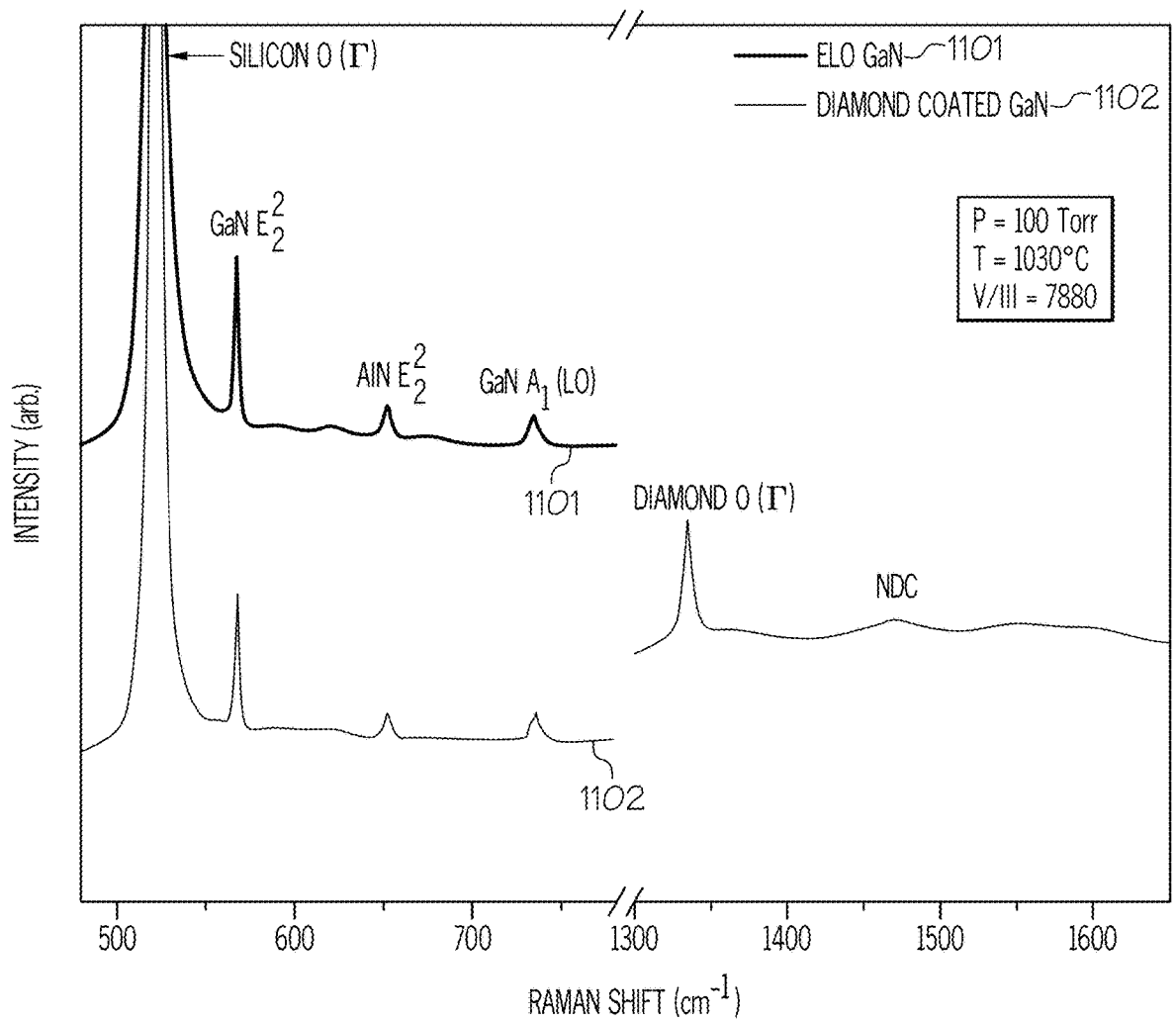
FIG. 11 illustrates the visible Raman (532 nm) of the ELOG wafer grown with P=100 Torr, T=1030° C. and V/III=7880 in accordance with an embodiment of the present invention.

The quality of ELOG GaN was further confirmed from Raman measurement results as shown in FIG. 11. FIG. 11 illustrates the visible Raman (532 nm) of the ELOG wafer grown with P=100 Torr, T=1030° C. and V/III=7880 in accordance with an embodiment of the present invention. Spectra 1101, 1102 in FIG. 11 represents Raman spectra collected on the ELOG region and diamond coated region, respectively. As seen from Raman spectrum 1101, clear Raman peaks were observed for Si O (Γ), GaN ($E_2^2$) AlN ($E_2^2$), and GaN $A_1$ (LO) phonon at ~520.6 cm$^{-1}$, at ~567.5 cm$^{-1}$, at ~650.3 cm$^{-1}$ and at ~733.5 cm$^{-1}$, respectively. In case of Raman spectrum collected from the diamond coated GaN region, a sharp diamond O (Γ) at ~1333.5 cm$^{-1}$ and broad non-diamond carbon (NDC) peak at 1450-1600 cm$^{-1}$ were visible. The observed offset of diamond peaks came from high fluorescence of NDC at the 532 nm laser line. The peak positions for the III-nitride semiconductor layers did not substantially change due to ELOG GaN growth. After fitting the peak position (Lorentzian) of the GaN Raman peak, it was found that the GaN ($E_2^2$)peak occurred at 566.45±0.1 cm$^{-1}$ on the diamond coated region and at 565.7±0.1 cm$^{-1}$ on the ELOG region. The 0.75±0.1 cm$^{-1}$ red shift in GaN ($E_2^2$) Raman peak on the ELOG region compared to the diamond coated region corresponds to ~0.22 GPa biaxial tensile stress. Other notable differences in the Raman spectra between the two regions were the higher relative intensity of the GaN peak due to increased thickness. Raman spectra observed on the ELOG region indicate increased tensile stress in regrown GaN 210 due to increased thickness and CTE mismatch between regrown GaN 210 and silicon.

In step 108, AlGaN 213 is grown on the ELOG GaN 210 as shown in FIG. 2F. As illustrated in FIG. 2F, a channel of highly mobile electrons called a two-dimensional electron gas (2DEG) exists near the interface between regrown GaN 210 and AlGaN 213.

After performing the ELOG of GaN 210, a thin barrier layer containing 25-30 at. % Al in AlGaN 213 is grown on top of the regrown GaN layer 210. This technique is well established for AlGaN/GaN HEMT fabrication. In one embodiment, the thickness of the barrier layer varies from 15-25 nm. In one embodiment, a passivating GaN cap layer with thickness 1-5 nm may be deposited on top of the device structure forming an AlGaN/GaN layer grown on the ELOG regrown GaN 210. At this step in the process sequence, the GaN-on-diamond wafer is ready for HEMT device processing. Alternatively, additional process steps may be administered as described below.

Figure 2H:
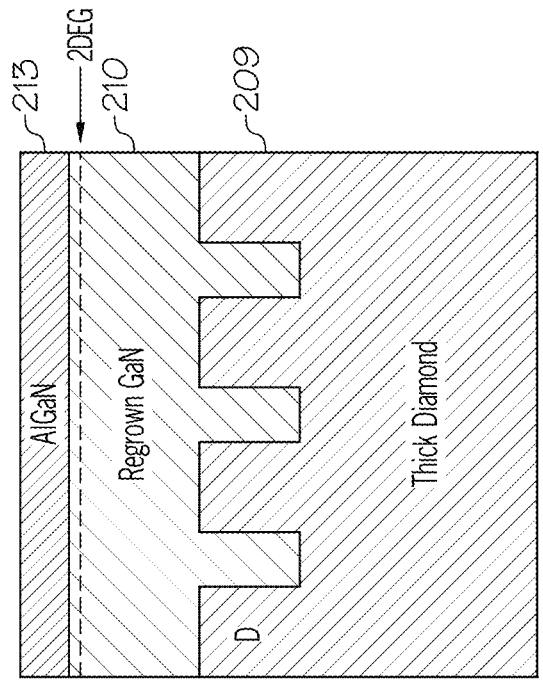
Figure 2G:
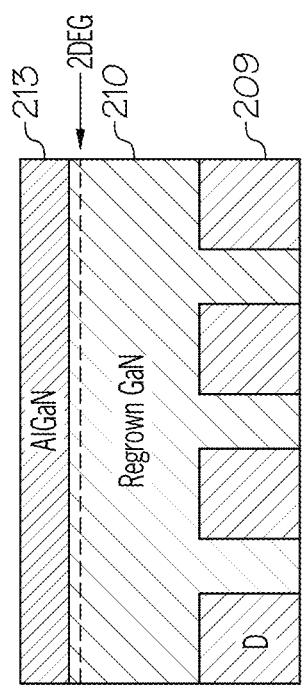

In step 109, the backside of the wafer is etched as shown in FIG. 2G.

In step 110, additional diamond 209 is grown on the backside of the wafer as shown in FIG. 2H.

After step 108, the wafer is taken out of the MOCVD reactor and is ready for the backside processing. The Si substrate 201 and all the stress reducing layers are removed using CMP, reactive ion etching and/or wet chemical etching. It is noted that the front side of the wafer should be protected during the rigorous etching process. In one embodiment, to protect the front side or device side of the wafer, a protection layer can be epitaxially grown or any handle wafer can be used. Examples of protective layer materials include spin on glass, epoxy or a sacrificial Si wafer attached using a wafer bonding process.

In one embodiment, the backside is etched through the etching process until it reaches diamond layer 209. Once diamond layer 209 is reached, etching is stopped. The resulting HEMT device structure is ready for device processing at this point. The structure is shown in FIG. 2G. At this point, the sacrificial protection layer can be removed and wafer may go to the device processing steps (e.g., metallization, mesa isolation and rapid thermal annealing, etc.). However, the wafer may suffer from mechanical stability (e.g., cracking or rolling due to stress).

To address mechanical stability, in another embodiment, the wafer may be placed in the CVD diamond reactor for growing a thick layer of diamond 209 on the backside as shown in FIG. 2H. Since the backside of the wafer has windows of patterned diamond, diamond 209 will grow from the patterned region. With a higher growth rate (e.g., achieved through higher methane concentration), diamond 209 will grow over the entirety of the surface by increased lateral growth. Diamond 209 can grow at a high rate in the lateral direction at the beginning of the diamond growth process and then grown in the vertical direction once a bridge is formed amongst the diamond grains. This process will facilitate the growth of a thick layer of diamond 209 on the backside of the HEMT wafer (entirety of FIG. 2G consisting of elements 209, 210, 213). The sacrificial protection layer can be removed at this point in the process by chemical etching or mechanically. FIG. 2H depicts the final structure after the backside diamond growth and removal of sacrificial protection layer/wafer. The resulting wafer is now a free standing AlGaN/GaN HEMT directly on diamond and ready for device processing.

It is noted that steps 108, 109, 110 are applicable for any III-nitride layer 210 or combination of III-nitride layers 210 as well and the resulting structure can be used to fabricate any other device, such as LEDs, lasers and sensors where an AlGaN barrier layer and 2DEG (see FIGS. 2G and 2H) may or may not be necessary.

Additional approaches for achieving GaN-on-diamond are discussed below.

Figure 12:
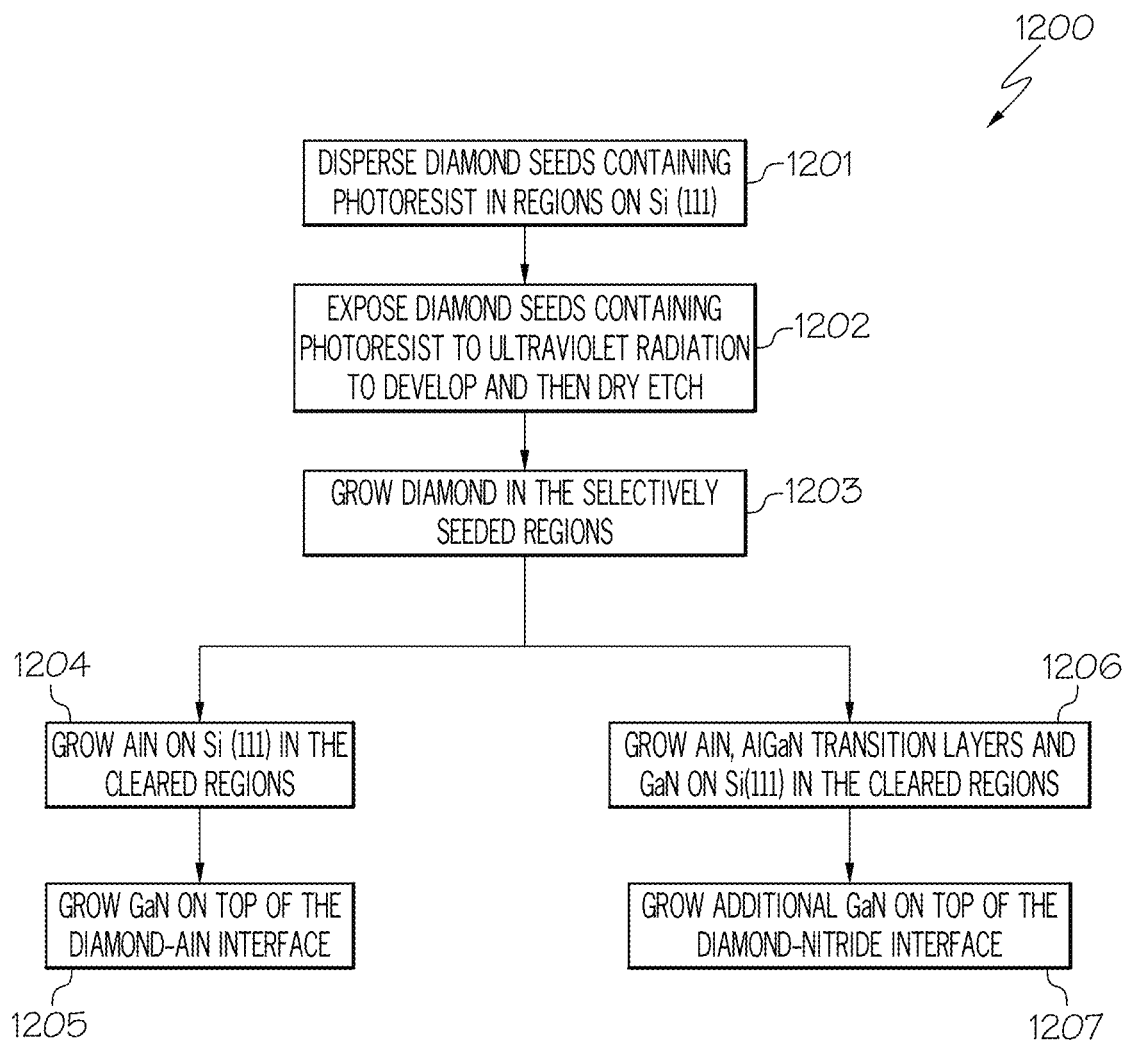
FIG. 12 is a flowchart of another approach to grow crystalline GaN on a polycrystalline CVD diamond substrate in accordance with an embodiment of the present invention.

FIG. 12 is a flowchart of another approach to grow crystalline GaN on polycrystalline CVD diamond substrate in accordance with an embodiment of the present invention. FIGS. 13A-13E depict the cross-sectional views for growing crystalline GaN on a polycrystalline CVD diamond substrate using the steps described in FIG. 12 in accordance with an embodiment of the present invention.

Figure 13A:
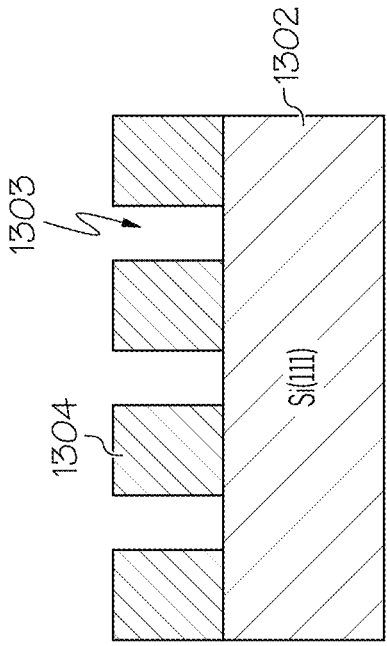
FIGS. 13A-13E depict the cross-sectional views for growing crystalline GaN on a polycrystalline CVD diamond substrate using the steps described in FIG. 12 in accordance with an embodiment of the present invention.

Referring to FIGS. 12 and 13A-13E, in step 1201, diamond seeds containing photoresist 1301 are dispersed in regions on Si(111) 1302 as shown in FIG. 13A.

Figure 13B:
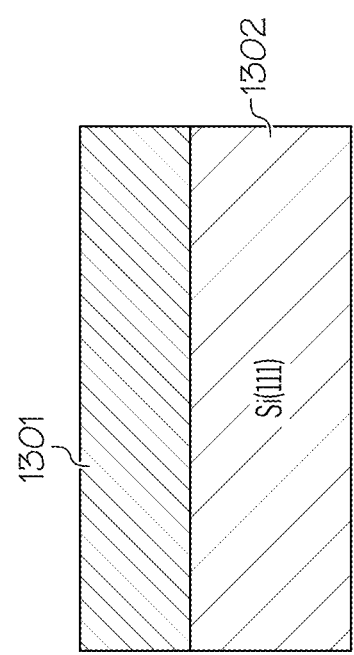

In step 1202, the diamond seeds containing photoresist 1301 are exposed to ultraviolet (UV) radiation to develop and then dry etch as shown in FIG. 13B. Such dry etching of the developed diamond seeds may result in forming regions 1303 free of diamond seeds and regions 1304 of diamond seeds.

Figure 13C:
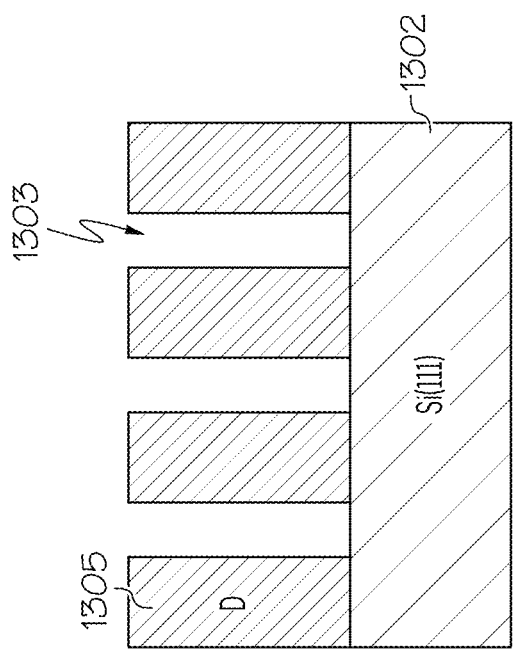

In step 1203, diamond (identified as "D" in FIG. 13C) 1305 is then grown in the selectively seeded regions 1304 for regions of diamond as shown in FIGS. 13B and 13C.

In one embodiment, selective deposition of III-nitride on Si windows of selectively deposited diamond on Si(111) produces a GaN-diamond wafer prepared with further reduced process complexity. Selective growth of diamond with narrow features on Si can be achieved by performing selective seeding. Selective seeding can be performed by dispersing diamond seeds containing photoresist 1301 on Si(111) 1302 followed by UV exposure and develop. Inductively coupled plasma (ICP)/reactive ion etching (RIE) with $C_4F_8$ and $O_2$ of the patterned wafer clears the remaining seeds from the open or window region resulting in high selectivity. In one embodiment, diamond growth in the selectively seeded regions can be performed with varied methane concentration.

One advantageous feature of this approach is the incorporation of high quality diamond on Si because there are no III-nitride semiconductor layers until after the diamond deposition, and, therefore, there is no issue with III-nitride decomposition associated therewith. Once the selective diamond wafer is prepared, III-nitride semiconductors can be deposited in the windows using one of two exemplary approaches.

Figure 13E:
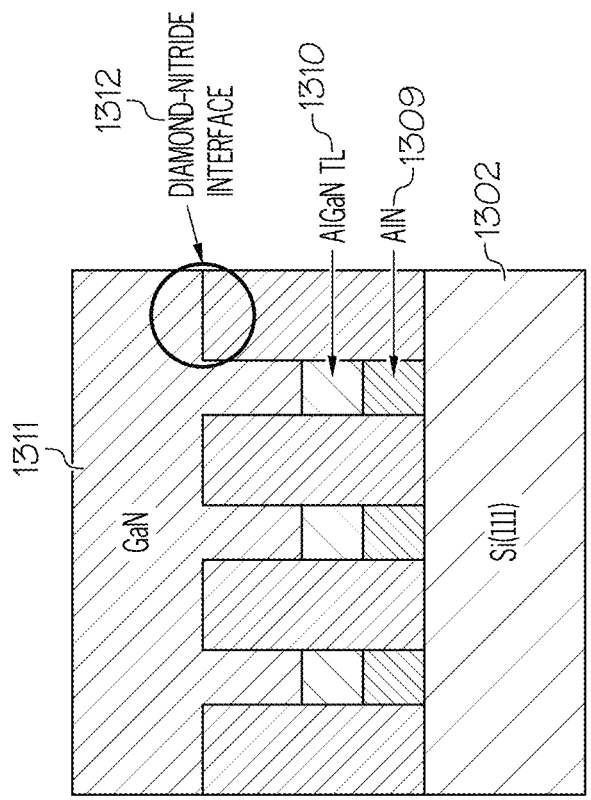
Figure 13D:
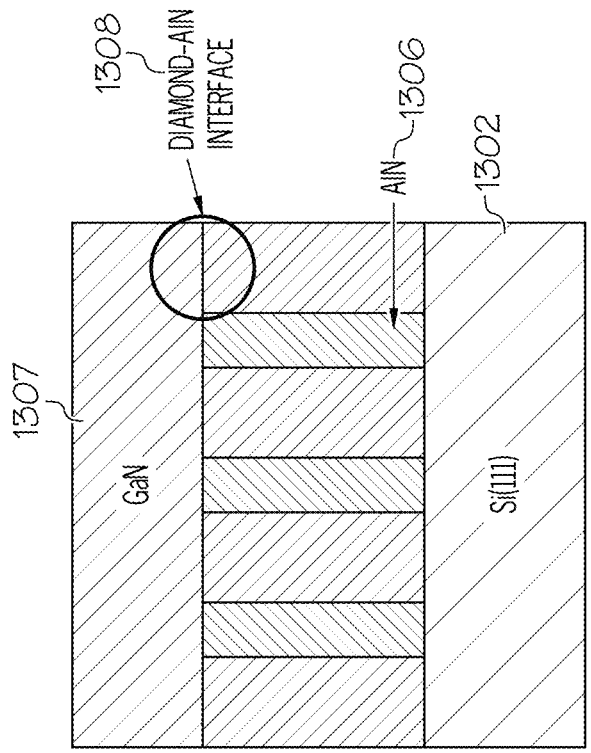

In one embodiment, in step 1204, AlN (aluminum nitride) 1306 is grown on Si(111) 1302 in the cleared regions 1303 as shown in FIGS. 13C and 13D.

In step 1205, GaN 1307 is grown on top of the diamond-AlN interface 1308 as shown in FIG. 13D.

In one approach, as shown in FIG. 13D, the selectively deposited diamond wafer is placed in the MOCVD chamber and AlN 1306 is grown on Si 1302 until it fills up the region between the diamond features. Later, the growth process is started for the epitaxial lateral overgrowth (ELOG) of GaN 1307 as explained above. Once the ELOG of GaN 1307 is achieved in this method, the wafer can be used to fabricate various devices, such as AlGaN/GaN HEMTs, LEDs, lasers, photodetectors, etc.

Referring again to step 1203, alternatively, in another embodiment, in step 1206, AlN 1309, AlGaN transition layers (TLs) 1310 and GaN 1311 are grown on Si(111) 1302 in the cleared regions (regions 1303) as shown in FIGS. 13C and 13E.

In step 1207, additional GaN 1311 is grown on top of the diamond-nitride interface 1312 as shown in FIG. 13E.

In the approach of steps 1206, 1207, as shown in FIG. 13E, the growth process may be the same as a standard AlGaN/GaN HEMT growth on Si. AlGaN/GaN will be grown until reaching the top of the diamond pillars. At this point, the growth parameters may be switched to the ELOG process as explained above.

Figure 15:
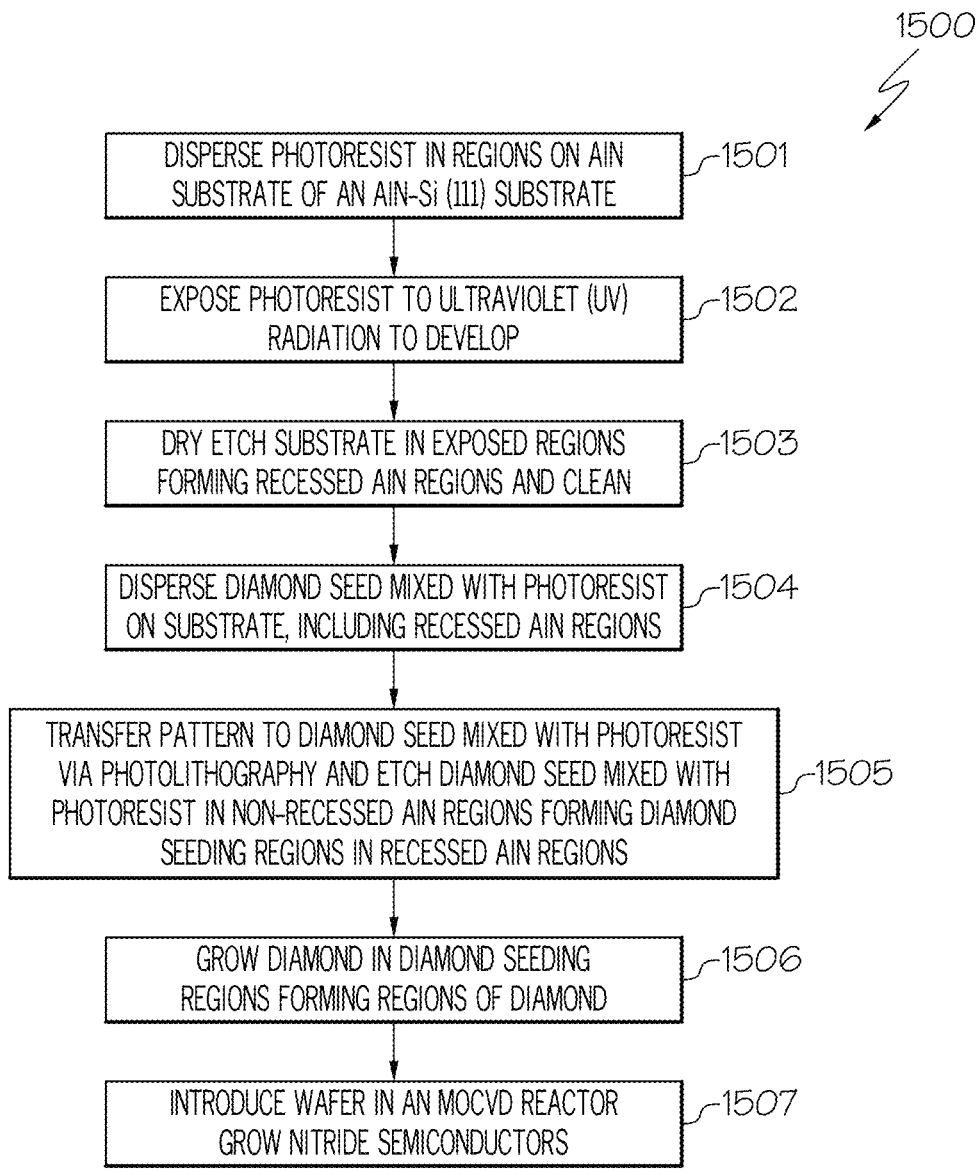
FIG. 15 is a flowchart of an alternative method for growing crystalline GaN directly on a CVD diamond substrate in accordance with an embodiment of the present invention.

FIG. 15 is a flowchart of an alternative method for growing crystalline GaN directly on a CVD diamond substrate in accordance with an embodiment of the present invention. FIGS. 16A-16G depict the cross-sectional views for growing crystalline GaN on a polycrystalline CVD diamond substrate using the steps described in FIG. 15 in accordance with an embodiment of the present invention.

Figure 16A:
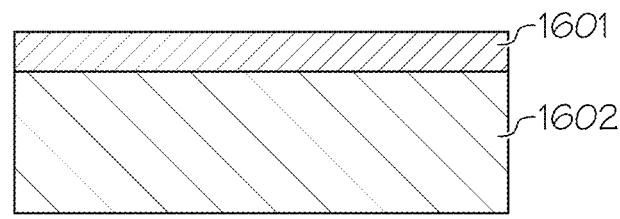
FIGS. 16A-16G depict the cross-sectional views for growing crystalline GaN on a polycrystalline CVD diamond substrate using the steps described in FIG. 15 in accordance with an embodiment of the present invention.

Referring to FIG. 15, in conjunction with FIGS. 16A-16G, in step 1501, photoresist 1601 is dispersed in regions on an AlN substrate 1602 or an AlN-Si (111) substrate as shown in FIG. 16A.

Figure 16B:
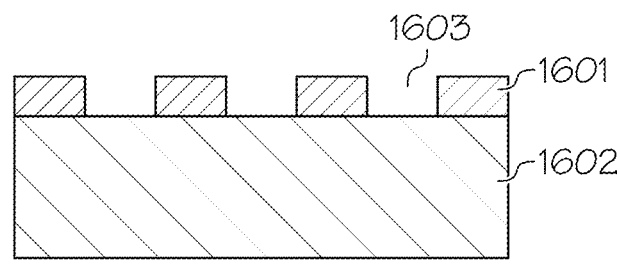
Figure 16C:
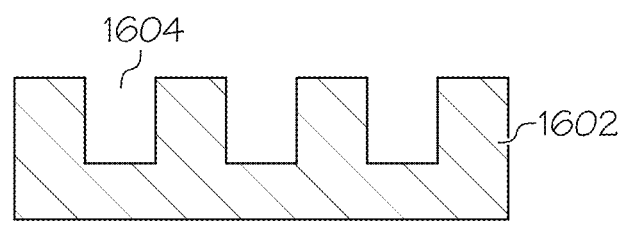

In step 1502, photoresist 1601 is exposed to ultraviolet (UV) radiation to develop thereby forming exposed regions 1603 as shown in FIG. 16B. In step 1503, substrate 1602 is dry etched in exposed regions 1603 and cleaned as shown in FIG. 16C. Such dry etching of the exposed regions results in recessed AlN regions 1604 after cleaning as shown in FIG. 16C.

Figure 16D:
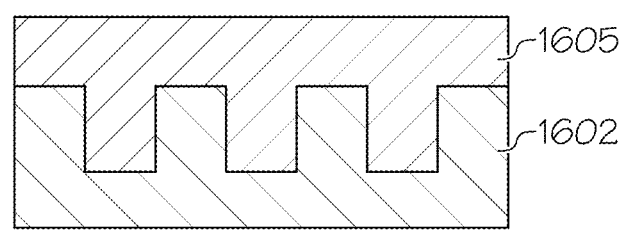

In step 1504, another round of photolithography takes place where diamond seed mixed with photoresist 1605 is dispersed on substrate 1602 (including recessed AlN regions 1604) as shown in FIG. 16D.

Figure 16E:
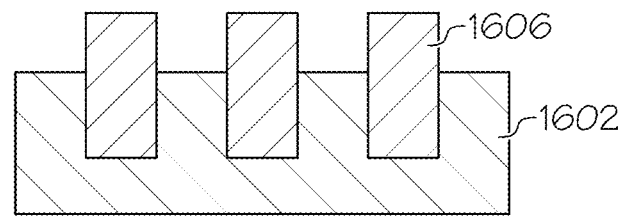

In step 1505, a pattern is transferred to the diamond seed mixed with photoresist 1605 via photolithography and the diamond seed mixed with photoresist 1605 is then etched in the non-recessed AlN regions forming diamond seeding regions 1606 as shown in FIG. 16E. In one embodiment, a photo mask/reticle (with opposite polarity than the mask used in FIG. 16B) is used to clear resist from the regions where resist remained from the previous photolithography step. In one embodiment, the use of an opposite polarity reticle/mask can be avoided if an opposite polarity photoresist (negative tone photoresists) is used. After the photoresist is developed, the wafer can be etched to have diamond seed containing resist on the recessed AlN wells. Etching can then clear the seeds from the AlN regions.

Figure 16F:
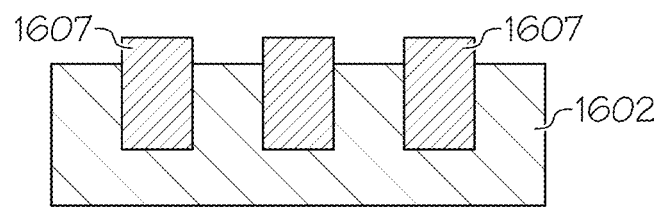

In step 1506, CVD diamond 1607 is grown on the selectively seeded regions as shown in FIG. 16F. That is, diamond is grown in the diamond seeding regions 1606 forming regions 1607 of diamond. In one embodiment, the wafer can be dry etched with low power to remove any damages to the AlN on the non-diamond regions as well as to increase GaN nucleation in step 1507.

Figure 16G:
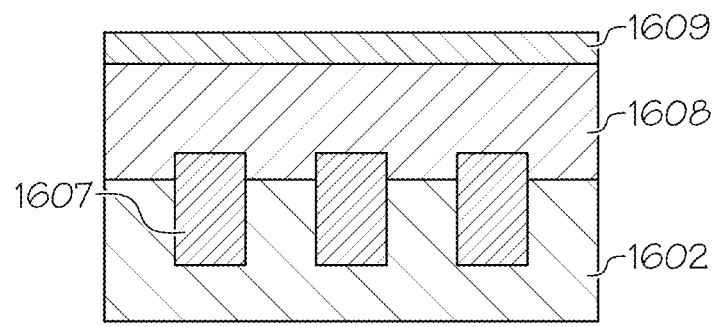

In step 1507, the wafer will be introduced in an MOCVD reactor and nitride semiconductors will be grown resulting in an AlGaN layer 1609 residing on GaN layer 1608, which resides on diamond 1607/AlN 1602 as shown in FIG. 16G (the rest of the process is already previously discussed). The final structure after nitride semiconductor growth is shown in FIG. 16G.

In one embodiment, selective deposition of GaN on AlN windows of selectively deposited diamond on Si(111) can produce a GaN-diamond wafer prepared with further reduced process complexity. Selective growth of diamond with narrow features on AlN can be achieved by performing selective seeding. Selective seeding can be performed by dispersing nano-diamond seeds containing photoresist on AlN or AlN-Si(111) followed by UV exposure and develop. Inductively coupled plasma (ICP)/reactive ion etching (RIE) with $C_4F_8$ and $O_2$ of the patterned wafer will clear the remaining seeds from the open or window region resulting in high selectivity. In one embodiment, diamond growth in the selectively seeded regions can be performed with varied methane concentration.

One advantageous feature of this approach is the incorporation of high-quality diamond on AlN because AlN does not decompose in a diamond CVD process or at most has minimal damage. Once the selective diamond wafer is prepared, one can deposit GaN directly in the windows without using any transition or buffer layers.

As shown in FIG. 16F, the diamond fingers 1607 are intentionally grown longer on the AlN surface to allow GaN to nucleate on the window region and then, by the time GaN reaches the top of the diamond, its crystal quality will improve.

Finally, ELO GaN is grown on top of the diamond fingers 1607 as shown in FIG. 16G.

One advantage of method 1500 over other previously described approaches is its reduced process complexity and avoiding the use of Si in the diamond-nitride semiconductor growth process. Usually, nucleating of a nitride semiconductor on Si requires high energy and cost. However, using the approach of method 1500, one can grow ELO GaN at a much lower cost compared to the process described above, such as in FIG. 12.

While the primary focus of these embodiments has been on III-nitride based materials, a person of ordinary skill in the art will understand that other materials can readily replace III-nitride and yield the benefits of diamond described herein. For example, III-oxide, III-arsenide, III-phosphide, III-antimonide, II-VI materials, silicon and germanium, including their alloys, as well as doped and undoped, are amongst the viable alternatives to III-nitride based materials.

Figure 14B:
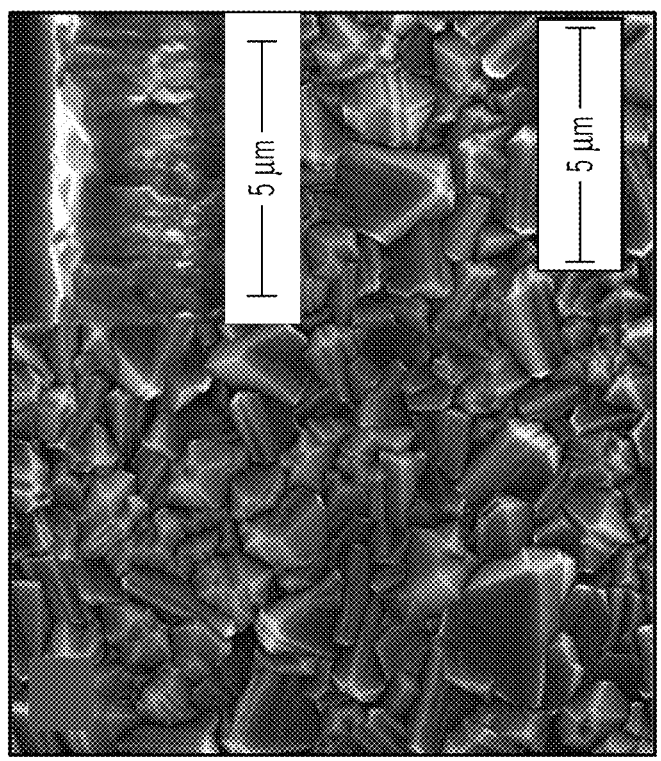
FIGS. 14A-14C are SEM micrographs of diamond films deposited for 8 hours with 1.5%, 3.0% and 4.5% methane, respectively, in accordance with an embodiment of the present invention.
Figure 14A:
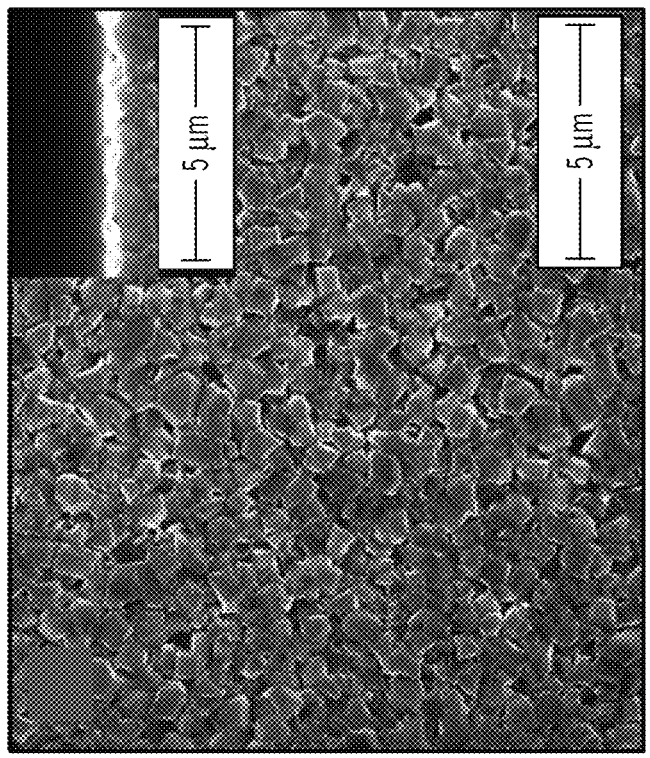
Figure 14D:
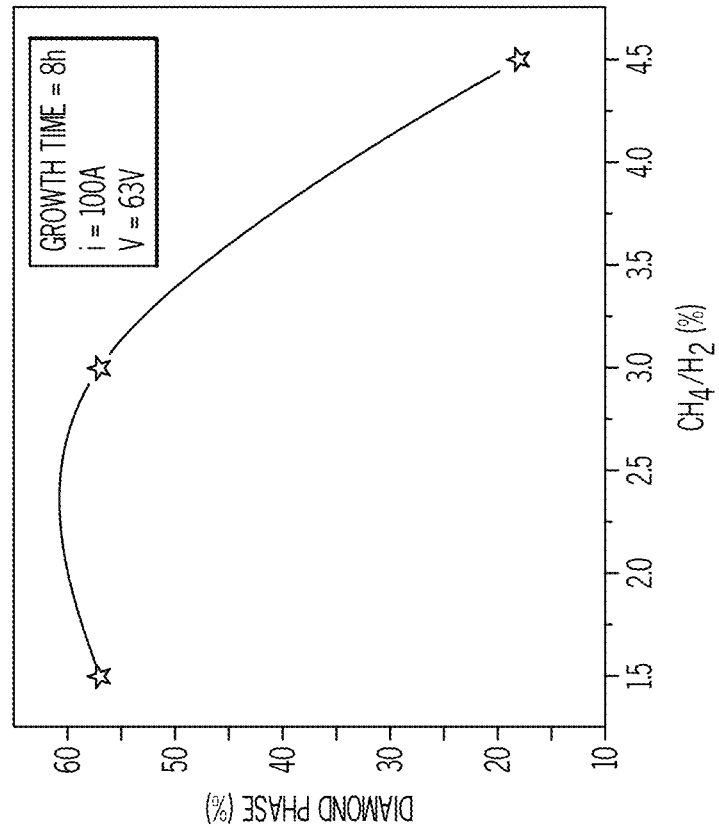
FIG. 14D is a graph illustrating the diamond phase in three samples determined from the integrated intensity ratios of diamond and the non-diamond carbon (NDC) peak of visible (532 nm) micro Raman spectra in accordance with an embodiment of the present invention.
Figure 14C:
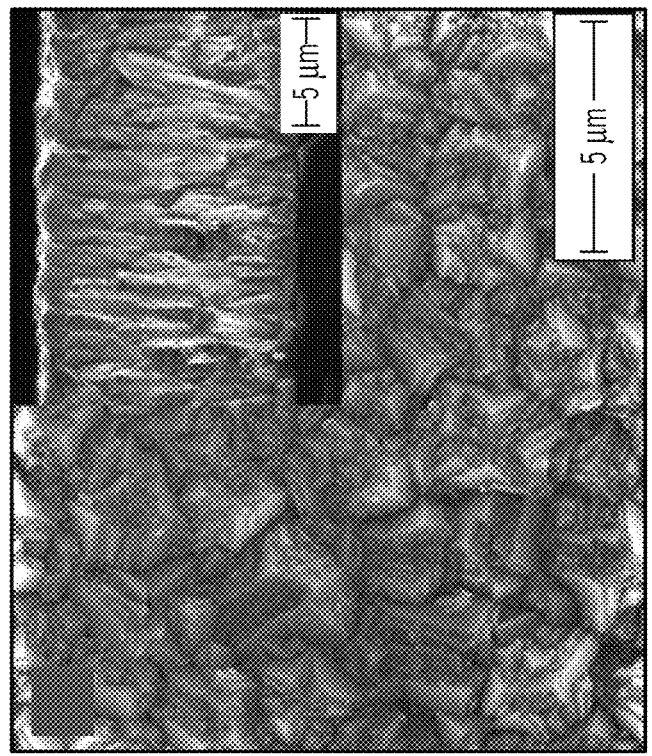

In one embodiment, the present invention utilizes the thermal conductivity of diamond where thermal conductivity of polycrystalline diamond is greatly dependent on grain size, thickness and the non-diamond carbon (NDC) percentage in the diamond. Although literature suggests that the best quality diamond can be achieved only when methane concentration is 1-3% in hydrogen, embodiments of the present invention have achieved diamond with methane concentration up to 4.5%. FIGS. 14A-14C are SEM micrographs of diamond films deposited for 8 hours with 1.5%, 3.0% and 4.5% methane, respectively, in accordance with an embodiment of the present invention. The insets are the corresponding cleaved cross section SEM images. FIG. 14D is a graph illustrating the diamond phase in three samples determined from the integrated intensity ratios of diamond and the NDC peak of visible (532 nm) micro Raman spectra in accordance with an embodiment of the present invention.

As discussed above, the physical appearance of the diamond film grown with 4.5% methane shows very good quality diamond surface. In one embodiment, the diamond growth was performed with 100 A current, 66 Volts for an array of nine tungsten wires with 0.25 mm (approximately 0.01 inches) diameter separated by 1 cm. The wire to wafer distance was maintained at 6 mm. The diamond phase concentration was found to be very high in the films as seen in FIG. 14D. The cleaved cross section of the diamond films shown as insets of FIGS. 14A-14C indicate that the diamond film thickness is an increasing function of methane concentration. In general, the lower methane concentration and the higher thickness of diamond films will result in better quality diamond. A better-quality diamond has higher $sp^a$ content compared to its $sp^2$ content.

As discussed herein, the present invention involves techniques for growing crystalline III-nitride semiconductors on polycrystalline diamond. In particular, embodiments of the present invention include techniques for growing crystalline GaN on polycrystalline diamond. Furthermore, as discussed herein, there is a direct and intimate interface at the GaN-diamond interface. Additionally, a diamond with the highest phase purity is in direct contact with GaN. Furthermore, the resulting GaN-diamond structure of the present invention is without any intervening dielectric adhesion layer. Additionally, the GaN-diamond interface is without any non-diamond carbon phase and/or poor thermally conductive graphitic layers and/or regions.

Furthermore, embodiments of the present invention include a technique for incorporating semiconductors, particularly GaN and AlGaN, on polycrystalline diamond substrates. In one embodiment, semiconductors are incorporated on polycrystalline diamond substrate using chemical vapor deposition (CVD) whereby single crystal or monocrystalline material is formed on polycrystalline diamond. This results in device material that is directly grown and/or in direct contact with the diamond substrate. The consequent structure results in devices that show significantly improved heat removal capability compared to other technologies.

Furthermore, the present invention fabricates devices that have a direct and intimate interface between the GaN-diamond. No dielectric adhesion layer is necessary, and the resulting GaN-diamond interface allows for superior performing devices—especially with regards to heat abatement from the semiconductor layer or layers. The development of both full coalescence and partial coalescence of GaN over diamond as enabled by the present invention has utilization in a variety of applications, such as optoelectronics, power and RF devices.

In addition to the key benefit of providing improved heat removal capability—embodiments of the present invention provide numerous other advantages when compared to competing technologies. It eliminates two key barriers that have limited the use of diamond substrates—thermal boundary resistance (TBR) between different layers and graphitic carbon in the diamond nucleation layer (at the GaN-diamond) interface. The technique of the present invention enables the direct growth and/or intimate contact of GaN on diamond with the active layer residing closest to the diamond substrate and thus overcoming the two key barriers noted above. While the technique of the present invention has focused primarily on GaN, it can also be used for other electronic and optoelectronic device fabrication, such as GaN light-emitting-diode (LED), semiconductor-based lasers, such as gallium arsenide (GaAs), indium phosphide (InP), silicon (Si), germanium (Ge)—all of which require enhanced thermal management techniques for effective and/or enhanced operation.

Furthermore, embodiments of the present invention reduce the complexity and cost of GaN on diamond device fabrication. Furthermore, the resulting structure of the present invention reduces device heating and enhances device reliability. In addition, the present invention facilitates the use of GaN-based devices to their full potential. To date, GaN-based power devices have demonstrated only approximately 10-20% of their maximum power handling capability, including with a diamond layer attached using prior art techniques. The main reason for such inferior performance is the process of diamond incorporation with such a device. Thermal boundary resistance between various layers, poor thermal conductivity of adhesion materials, poor thermal conductivity of diamond nucleation layers, etc., are main factors behind such inferior performance. The present invention results in a device structure having none of these limiting factors and exhibits substantially superior performance compared to the present state-of-the-art devices. Furthermore, the simplified fabrication technique disclosed herein offers a cost-effective alternative for the semiconductor manufacturer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for incorporating semiconductors on a diamond substrate, the method comprising:
    growing a buffer layer on a transition layer residing on a substrate, wherein said buffer layer comprises a first Group III semiconductor material, wherein said transition layer comprises a second Group III semiconductor material;
    growing a silicon nitride layer on said buffer layer;
    performing selective seeding of diamond on said silicon nitride layer to form regions with seeded diamond and regions without seeded diamond;
    performing selective etching of said silicon nitride layer in said regions without seeded diamond to form etched regions without seeded diamond;
    growing diamond in said regions with seeded diamond to form regions of diamond corresponding to said diamond substrate;
    additionally growing said first Group III semiconductor material in said etched regions without seeded diamond to fill said regions without seeded diamond to reach a level of said regions of diamond; and
    performing an epitaxial overgrowth of said first Group III semiconductor material at said level of said regions of diamond.

2. The method as recited in claim 1, wherein said first Group III semiconductor material comprises gallium nitride.

3. The method as recited in claim 1, wherein said second Group III semiconductor material comprises aluminum nitride and/or aluminum gallium nitride.

4. The method as recited in claim 1, wherein said silicon nitride layer is grown on said buffer layer using metal organic chemical vapor deposition or plasma-enhanced chemical vapor deposition.

5. The method as recited in claim 1, wherein said selective seeding of diamond on said silicon nitride layer is performed using photolithography.

6. The method as recited in claim 1, wherein said diamond is grown in said regions with seeded diamond using chemical vapor deposition.

7. The method as recited in claim 1, wherein said additionally grown first Group III semiconductor material is grown in said regions without seeded diamond using metal organic chemical vapor deposition.

8. The method as recited in claim 1 further comprising:
growing an alloy semiconductor material on said epitaxial overgrowth of said first Group III semiconductor material, wherein a channel of mobile electrons exists in an interface between said epitaxial overgrowth of said first Group III semiconductor material and said alloy semiconductor material.

9. The method as recited in claim 8, wherein said alloy semiconductor material comprises aluminum gallium nitride.

10. The method as recited in claim 8 further comprising:
etching a backside of a wafer; and
growing additional diamond on said backside of said wafer.

* * * * *